United States Patent
Adachi et al.

(10) Patent No.: US 6,999,806 B2
(45) Date of Patent: Feb. 14, 2006

(54) HIGH TEMPERATURE SUPERCONDUCTING JOSEPHSON JUNCTIN, SUPERCONDUCTING ELECTRONIC DEVICE PROVIDED WITH THE FORMER AND METHOD OF MANUFACTURING HIGH TEMPERATURE SUPERCONDUCTING JOSEPHSON JUNCTION

(75) Inventors: Seiji Adachi, Inzai (JP); Hironori Wakana, Tokyo (JP); Keiichi Tanabe, Mito (JP)

(73) Assignee: International Superconductivity Technology Center, the Juridical Foundation, Tokyo (JP)

( * ) Notice: Subject to any disclaimer, the term of this patent is extended or adjusted under 35 U.S.C. 154(b) by 212 days.

(21) Appl. No.: 10/466,077

(22) PCT Filed: Aug. 16, 2002

(86) PCT No.: PCT/JP02/08320

§ 371 (c)(1),
(2), (4) Date: Jul. 10, 2003

(87) PCT Pub. No.: WO03/019684

PCT Pub. Date: Mar. 6, 2003

(65) Prior Publication Data

US 2004/0077504 A1   Apr. 22, 2004

(30) Foreign Application Priority Data

Aug. 22, 2001 (JP) ............................. 2001-251137
Mar. 8, 2002 (JP) ............................. 2002-064448

(51) Int. Cl.
*H01L 23/48* (2006.01)
*H01L 27/00* (2006.01)
*H01L 29/00* (2006.01)
*H01B 12/00* (2006.01)

(52) U.S. Cl. ...................... 505/190; 505/234; 505/329; 257/32; 257/33; 257/35

(58) Field of Classification Search ................ 505/190, 505/230, 234, 237, 238, 329, 162, 434, 473–477, 505/702, 741, 817, 832, 861, 864, 865, 874, 505/871; 257/30, 32, 33, 35, 661–663; 174/125.1; 365/160–162; 427/62, 402, 419.1–419.3
See application file for complete search history.

(56) References Cited

U.S. PATENT DOCUMENTS 5,028,583 A   7/1991   Tanaka et al.

FOREIGN PATENT DOCUMENTS

EP   0 322 306   6/1989

OTHER PUBLICATIONS

Susumu Takada, *Applied Physics*, vol. 62, No. 5, pp. 443-454 (1993).

(Continued)

*Primary Examiner*—Colleen P. Cooke
(74) *Attorney, Agent, or Firm*—Kolisch Hartwell, P.C.

(57) ABSTRACT

A Josephson junction having a barrier layer sandwiched by two superconductors wherein the superconductors include one or more elements selected from the group of Y, La, Nd, Sm, Eu, Gd, Dy, Ho, Er, Tm, Yb and Lu, one or more elements selected from the group of Ba, Sr and Ca, and Cu and oxygen, wherein the two superconductors each include at least five elements with compositions different from each other, or the barrier layer (5) includes one or more elements selected from the group of La, Nd, Sm and Eu, and one or more elements selected from the group of Y, Gd, Dy, Ho, Er, Tm, Yb and Lu.

19 Claims, 5 Drawing Sheets

U.S. PATENT DOCUMENTS

| | | | | |
|---|---|---|---|---|
| 5,892,243 | A | * | 4/1999 | Chan .......................... 257/31 |
| 5,939,730 | A | * | 8/1999 | Durand et al. ................ 257/31 |
| 6,004,907 | A | * | 12/1999 | Suh et al. .................... 505/329 |
| 6,066,600 | A | * | 5/2000 | Chan .......................... 505/329 |
| 6,476,413 | B1 | * | 11/2002 | Jia et al. ...................... 257/33 |

FOREIGN PATENT DOCUMENTS

| | | | |
|---|---|---|---|
| JP | 1-188661 | | 7/1989 |
| JP | 6-263588 | | 9/1994 |
| JP | 2000-150974 | | 5/2000 |
| WO | WO 97/15955 A1 | * | 5/1997 |

OTHER PUBLICATIONS

Mutsuo Hikada et al., *Applied Physics*, vol. 67, No. 10, pp. 1167-1170 (1998).

B.H. Moeckly et al., "Properties of interface-engineered high $T_c$ Josephson junctions," *Appl. Phys. Lett.* 71 pp. 2526-2528 (Oct. 27, 1997).

J.G. Wen et al., "Atomic structure and composition of the barrier in the modified interface high-$T_c$ Josephson junction studied by transmission electron microscopy," *Appl. Phys. Lett.* 75, pp. 2470-2472 (Oct. 18, 1999).

Soutome et al., *Proceedings of 62nd Academic Lecture Conference of the Japanese Applied Physics Society*, No. 1, p. 195, 14-G-7 (Sep. 11-14, 2001).

R.D. Shannon, "Revised Effective Ionic Radii and Systematic Studies of Interatomic Distances in Halides and Chalcogenides," *Acta Cryst.*, A32, pp. 751-767 (1976).

D.M. de Leeuw et al., Compounds and Phase Compatibilities in the System $Y_2O_3$-BaO-CuO at 950°C, *Physica C.*, 152, pp. 39-49, (1988).

Hideaki Zama, et al., "New Growth Conditions for the c-Axis Oriented $NdBa_2Cu_3O_x$ Films by Pulsed Laser Deposition: Lower Substrate Temperature and Higher Oxygen Pressure," *Jpn. J. Appl. Phys.*, vol. 38, pp. L-923-L925 (1999).

Soutome et al., "Analysis of the surface-modified barrier in YbaCuO ramp-edge Josephson junctions," *Advances in Superconductivity XII*, Proceedings of the 12th International Symposium on Superconductivity, Oct. 17-19, 1999, pp. 990-992.

T. Satoh et al., "High-Temperature Superconducting Edge-Type Josephson Junctions with Modified Interfaces," *IEEE Transactions on Applied Superconductivity*, vol. 9, No. 2 (Jun. 1999).

J. Talvacchio et al., "Materials Basis for a Six-Level Epitaxial HTS Digital Circuit Process," *IEEE Transactions on Applied Superconductivity*, vol. 7, No. 2 (Jun. 1997).

J.G. Bednorz et al., "Possible High $T_c$ Superconductivity in the Ba-La-Cu-O System," *Z. Phys. B.*, vol. 64, pp. 189-193 (1986).

J.G. Wen et al., "Identification of Barrier in the Modified Interface High-$T_c$ Josephson Junction by TEM," in T. Yamashita et al., (eds.), *Advances in Superconductivity XII*, Proceedings of the 12th International Symposium on Superconductivity (ISS'99), pp. 984-989, Oct. 17-19, 1999.

International Search Report, PCT/JP02/08320, issued Nov. 19, 2002.

* cited by examiner

HIGH TEMPERATURE SUPERCONDUCTING JOSEPHSON JUNCTIN, SUPERCONDUCTING ELECTRONIC DEVICE PROVIDED WITH THE FORMER AND METHOD OF MANUFACTURING HIGH TEMPERATURE SUPERCONDUCTING JOSEPHSON JUNCTION

TECHNICAL FIELD

The present invention relates to a high temperature superconducting Josephson junction, a superconducting electronic device provided with the high temperature superconducting Josephson junction, and a method of manufacturing the high temperature superconducting Josephson junction.

BACKGROUND ART

A superconductor with unique properties such as (1) having zero electric resistance, (2) being perfect diamagnet and (3) exhibiting the Josephson effect, is expected to have wide applications including transmission of electric power, generation of electric power, confinement of plasma for nuclear fusion, magnetically levitated vehicles, magnetic shields, ultra-high sensitivity magnetic sensors, high-speed microwave communication devices and high-speed computers.

In the past, known superconductors were only those having low superconducting transition temperatures (Tc) such as NbTi and $Nb_3Sn$. In 1986, Bednorz and Mueller discovered a copper oxide high temperature superconductor $(La_{1-x}Ba_x)_2CuO_4$ that has a superconducting transition temperature (Tc) of about 30K (J. G. Bednorz and K. A. Mueller: Z. Phys. B64, 189 (1986)).

This report was followed by successive reports of oxide high temperature superconductors having ever higher superconducting transition temperatures (H-Tc) such as $YBa_2Cu_3O_y$ (Tc=90K), $Bi_2Sr_2Ca_2Cu_3O_y$ (Tc=110K), $Tl_2Ba_2Ca_2Cu_3O_y$ (Tc=125K), $HgBa_2Ca_2Cu_3O_y$ (Tc=135K). Many researches have been conducted and published on the manufacturing method, physical properties and applications of these materials. Among these materials, $YBa_2Cu_3O_y$ is a high temperature superconductor that does not include harmful substances such as Tl and Hg and has relatively low anisotropy, and is therefore viewed as the most promising candidate for a material to be used in practical applications such as electronic devices and electric wires. It is known that the most useful superconducting properties can be obtained when the valence n of copper atom ($Cu^{n+}$) in the formula is within a range of 2.0<n<2.67, each superconductor having a sufficient number of oxygen atoms to meet the requirements of a the valence of copper.

The $YBa_2Cu_3O_y$ superconductors is known to exhibit superconducting transition temperature Tc of about 90K also when the component Y is replaced with a rare earth element (La, Nd, Sm and Eu, Gd, Dy, Ho, Er, Tm, Yb, Lu) (superconductors obtained from such substitution are collectively called the 123 superconductor.)

Applications of superconductor to electronic devices include a Josephson device that utilizes the Josephson effect, that requires the Josephson junction forming technology that employs physical film forming process such as sputtering or laser deposition process to form a thin film. For the Josephson junction of an oxide high temperature superconductor, various forms have been proposed including bi-crystal junctions, bi-epitaxial junctions, step-edge junctions, bridge junctions, ramp-edge junctions and stacked junctions (Susumu Takada, Oyo Butsuri 62, 443 (1993)). Among these, the ramp-edge junction that has a tunneling barrier layer formed obliquely between a pair of oxide high temperature superconductors, in particular, is viewed as a promising junction structure because the tunneling barrier layer has a high driving capability during switching operation and the critical current can be controlled by adjusting the thickness of the tunneling barrier layer (Mutsuo HIDAKA, Tetsuro SATO, Shuichi TAHARA: Oyo Butsuri 67, 1167 (1998)).

FIG. 1 schematically shows the ramp-edge type Josephson junction.

The ramp-edge type Josephson junction is formed by depositing a high temperature superconductor thin film 2 as a first superconductor on a substrate 1 by a physical film forming process, forming an inter-layer insulation film 3 such as $CeO_2$ or $SrTiO_3$ on the high temperature superconductor thin film, etching the high temperature superconductor thin film 2 together with the inter-layer insulation film so as to form an edge, forming a layer that would make a barrier on the edge surface 2a so as to form a junction, and depositing a high temperature superconductor thin film 4 as a second superconductor thereon.

Indicators that represent the performance of a Josephson junction include IcRn product. The IcRn product is the product of the maximum current (critical current Ic), that can flow under superconducting condition at a given temperature, and the resistivity (Rn) of the junction that has returned to the state of normal conductivity upon disruption of superconductivity, the product being normalized by the dimension of the junction. Qualitatively, the IcRn product represents the magnitude of signal handled during switching. The larger the IcRn product, the higher the speed of switching operation can be made.

The ramp-edge junction shows larger value of IcRn product than the Josephson junctions of other structures. For example, such a ramp-edge junction has been proposed that $PrBa_2Cu_3O_y$ (PBCO) is used for the tunneling barrier layer and $YBa_2Cu_3O_y$ (YBCO) is used for the high-temperature superconductor that makes the upper and lower electrodes.

The stacked junction is made by stacking an oxide high temperature superconductor layer, a tunneling barrier layer and an oxide high temperature superconductor layer one on another, and has been researched for the prospect of being advantageously used in building large-scale integration in the future.

FIG. 2 is a sectional view of a stacked type high temperature superconducting Josephson junction. The stacked type high temperature superconducting Josephson junction is made by forming a first superconductor 2 and an inter-layer insulation film 3 successively on a substrate 1, forming an opening 3b in the inter-layer insulation film 3 at a position where a Josephson junction is to be made, making a junction by forming a barrier layer in the opening 3b, and depositing a second superconductor 4 thereon.

In the ramp-edge junction and the stacked junction, $PrBa_2Cu_3O_y$ (PBCO) layer, Nb-doped $SrTiO_3$ layer or a process-damaged layer is used as the tunneling barrier layer. The tunneling barrier formed in the form of a thin film is referred to as an artificial barrier. The tunneling barrier that utilizes, without forming a thin film, a layer of which the surface has been damaged by the bombardment of ions during the process is referred to as Interface-Engineered Junction (IEJ).

The IEJ has such an advantage that larger tunnel current can be drawn because of an extremely thin junction layer, and therefore has been researched extensively (B. H. Moeckly et al., Appl. Phys. Lett. 71, 2526 (1997)).

In the IEJ, existence of an extremely thin layer having thickness of around 1 to 2 nm formed in the junction has been confirmed through observation with a transmission electron microscope (TEM). This extremely thin layer is believed to function as the Josephson junction, although detailed structure thereof is yet to be established (for example, J. G. Wen et al., "Advances in Superconductivity XII"-Proc.ISS' 99, p. 984, (Oct. 17–19, 1999), Y. Soutome et al., "Advances in Superconductivity XII"-Proc.ISS' 99, p. 990, (Oct. 17–19, 1999)).

A first problem encountered in the prior art will now be described below. Recently a schematic diagram of the junction structure based on observation as shown in FIG. 3 has been published (Y. Soutome et al., "Advances in Superconductivity XII"-Proc. ISS' 99 (Oct. 17–19, 1999, Morioka) P. 990)

The diagram shows that the intervals between $CuO_2$ planes, that are major transmission paths for high temperature superconduction, in the c-axis direction are the same in the first and second superconductors since the junction is formed by using the same high temperature superconductor for the first and second superconductors. As a result, it can easily be anticipated that failure to satisfactorily perform as a Josephson junction may occur frequently as the junction layer becomes unacceptably thinner due to minor fluctuations in the process conditions during the formation of the junction that is carried out under very sensitive conditions, resulting in short circuiting in the junction. This problem will be described below with reference to FIGS. 4A through 4C.

FIGS. 4A through 4C illustrate the current-voltage (I-V) characteristic across the junction varying with different thickness of the Josephson junctions.

When the junction layer is too thick, superconducting current cannot flow as shown in FIG. 4A.

When the junction layer has a proper thickness, superconducting current can flow by tunneling through the junction without causing a voltage within the range of critical current Ic, as shown in FIG. 4B. As soon as the current exceeds the critical current Ic, a voltage appears across the junction. The I-V curve of the case, where the voltage appears, asymptotically approaches the straight line that passes the origin of the coordinate system. This intrinsic I-V characteristic of the Josephson junction is called the RSJ (Resistively Shunted Junction) characteristic.

In case the junction layer is too thin resulting in short circuiting, on the other hand, a voltage gradually appears when the current is higher than the critical current Ic as shown in FIG. 4C. This phenomenon is called the FF (Flux Flow) type I-V characteristic, since the voltage is induced by the movement of magnetic flux.

When the first and second superconductors are made of the same superconductor material as the example shown in FIG. 3, FF type I-V characteristic is likely to result since the first and second superconductors have high affinity with each other so that the first and second superconductors may be short circuited across the interface of the junction at some points if the conditions of forming the second superconductor are similar to those of the first superconductor.

Based on the above discussion, I-V characteristic of a junction may be made less likely to become FF type by forming the first and second superconductors from materials of different compositions, thereby causing the first and second superconductors to have less affinity with each other. When the first and second superconductors are formed from materials of different compositions, the superconductors have different intervals between $CuO_2$ planes, that are major transmission paths in the high temperature superconductors, in the c-axis direction, so that the $CuO_2$ planes of the first and second superconductors become less compatible to each other at the junction, and the junction should be less likely to have FF type I-V characteristics as shown in FIG. 5.

With this background, candidates for the material to form Josephson junctions extended from $YBa_2Cu_3O_y$ to $YBa_{1.95}La_{0.05}Cu_3O_y$ where a part of Ba is replaced with a trace of La, and $NdBa_2Cu_3O_y$ or $YbBa_2Cu_3O_y$ where Y is replaced with Nd or Yb. Thus such combinations of second superconductor/first superconductor as $YBa_2Cu_3O_y/NdBa_2Cu_3O_y$, $YbBa_2Cu_3O_y/YBa_2Cu_3O_y$, $Y(Ba,La)_2Cu_3O_y/YBa_2Cu_3O_y/YBa_2Cu_3O_y$, and $YBa_2Cu_3O_y/Y(Ba,La)_2Cu_3O_y$ have been tried.

However, satisfactory I-V characteristic of the junction could not necessarily be obtained from the combinations described above.

Moreover, producing Josephson junctions that have high reliability requires the use of high quality materials for both the first and second superconductors, as well as solving the problem of affinity between the first and second superconductor materials.

For this reason, when making a Josephson junction that requires a process of stacking a multitude of thin films, for example, care must be exercised to avoid adversely affecting the quality of the underlying first superconductor, that has been formed beforehand, during the process of forming the second superconductor. In other words, formation of the second superconductor thin film in a Josephson junction, particularly ramp-edge type Josephson junction, must be done under such conditions that do not degrade the first superconductor that has been formed beforehand.

However, a physical film forming process such as sputtering process or laser deposition process does not offer process conditions having large margins that allow it to form a c-axis orientation film that is good in all respects including superconductivity, surface flatness and crystallinity, which are related to achieving high quality of superconductor film.

As an example, in FIG. 6, a black bar indicates a range of substrate temperatures that allow it to form a c-axis orientation film of flat surface from $LnBa_2Cu_3O_y$ (Ln=Nd, Sm and Eu, Gd, Dy, Ho, Er, Tm, Yb or Y) by the off-axis high frequency sputtering process.

Simply forming a c-axis orientation film may be possible over a wider range of temperatures, although tolerance is restricted to such a narrow range of temperatures as shown in FIG. 6, when it comes to forming a thin film of high quality with surface roughness Ra of 5 nm or less as measured with an atomic force microscope (AFM) as well as being visibly flat as viewed by an optical microscope.

Therefore, it is a very tedious task to find out the optimum film forming conditions for both the second superconductor and the first superconductor. Furthermore, operating conditions of thin film manufacturing apparatuses may differ from one apparatus to another, and there may be cases in which proper conditions for forming a c-axis orientation film of high quality cannot be found for the two superconductor materials that have been selected.

Accordingly, since it is nearly impossible to form thin films of the best quality for the first and second superconductors, the upper and lower electrodes are formed while seeking trade-off points, in the actual film forming process.

Thus, it is difficult to obtain a product having high performance and high reliability, even in the case of a Josephson junction formed by using the same material for both the first and second electrodes, and it is much more difficult to obtain a product having good quality in terms of superconductor films and high reliability, in the case of a Josephson junction formed by using different materials for the first and second superconductors.

The most important portion of a Josephson junction, ramp-edge type Josephson junction in particular, is a layer as thin as 1 to 2 nm where the first and second superconductors make contact, and reliability of the product device depends on establishing the technology to form this portion with good reproducibility. Actually, however, the conditions for reliably forming the desired junction have not been clarified.

Now, the second problem of the prior art will be described below. When process parameters are improperly set for forming a ramp-edge junction or stacked junction, short circuiting may occur across the junction layer at some points thereof as it becomes difficult to control the very small thickness of the junction layer. Current-voltage characteristics (I-V characteristic) of the junction vary depending on the thickness of the junction.

When the junction layer is too thick, superconducting current cannot flow and therefore the junction shows current-voltage characteristic (I-V characteristic) of a resistive material as shown in FIG. 4A.

When the junction layer has a proper thickness, superconducting current can flow by tunneling through the junction without causing a voltage within the range of critical current Ic as shown in FIG. 4B. As soon as the current exceeds the critical current Ic, a voltage appears across the junction. The I-V curve of the case, where the voltage appears, asymptotically approaches the straight line that passes the origin of the coordinate system. This intrinsic I-V characteristic of the Josephson junction is called the RSJ (Resistively Shunted Junction) characteristic.

In case the junction layer is too thin, resulting in short circuiting, on the other hand, voltage gradually appears when the current is higher than the critical current Ic as shown in FIG. 4C. This phenomenon is called the FF (Flux Flow) I-V characteristic, since the voltage is induced by the movement of magnetic flux.

Producing a superconducting electronic device that employs the Josephson effect requires it to form a number of Josephson junctions that show the RSJ characteristic described above and have appropriate values of critical current Ic and IcRn product. At present, however, there is significant variance among the Josephson junctions, and satisfactory levels of stability of characteristics and reliability have not been achieved.

In particular, since critical current Ic is sensitive to the junction structure and manufacturing process, there is an urgent need for a technology that restrains the variation in the critical current Ic.

In order to achieve industrial application of the Josephson junction, it is essential to establish a technology to manufacture a plurality of Josephson junctions, that operate with proper characteristics, with good reproducibility. To achieve large scale integration in the future, capability to manufacture a large number of Josephson junctions with smaller variance in the characteristics thereof is required. While research efforts have so far been focused on the Josephson junction that uses an oxide high temperature superconductor having a high superconducting transition temperature (Tc), with the aim of achieving a superconducting electronic device having higher operating temperature. However, verification of operation has been limited to small circuits because of significant variability in the characteristics.

According to J. Talvacchio et al, for example, in order to have a circuit consisting of 100 junctions or more to operate, variations in the characteristics represented in terms of the proportion (percentage) of standard deviation ($\sigma$) of the value of the characteristic in question to the mean value of the characteristic (X) must be controlled to within 10% (100 $\sigma/X \leq 10$) (J. Talvacchio et al., IEEE Trans. Appl. Supercond. 7, 2051 (1997)). A successful case of achieving this requirement for ramp-edge type Josephson junction has recently been reported.

Meanwhile Satoh et al. achieved variance (100 $\sigma/X$) of 8% at 4.2K for 100 junctions made by using $YBa_2Cu_3O_y$ for the superconductor electrode and $(La_{0.3}Sr_{0.7})(Al_{0.65}Ta_{0.35})O_y$ for the insulation layer (T.Satoh et al., IEEE Trans. Appl. Supercond. 9, 3141 (1999), Japanese Unexamined Patent Application, First Publication No.2000-150974 A).

According to Satoh et al., good junction characteristics are achieved due to a uniform barrier layer of thickness within 2 nm being formed between two superconductor electrodes and mixing of La that has diffused from the insulation layer into the interface during etching. But concentration of La that has mixed in is extremely low and cannot be detected by observing with an analytical type transmission electron microscope that uses characteristic X-rays generated by irradiating an electron beam about 1 nm in diameter (J. G. Wen et al., Appl. Phys. Lett. 75 (1999)).

Saotome et al. achieved a standard deviation ($\sigma$) of 7.9% at 4.2K for 100 junctions made by using $YBa_2Cu_3O_{y-x}$ for the superconductor electrode and $CeO_2$ for the insulation layer (Soutome et al., Proceedings of 62nd Academic Lecture Conference of The Japanese Applied Physics Society, No. 1, p. 195 14a-G-7 (Sep. 11–14, 2001)). They did not use any material that included La, and achieved the value described above with such a structure and a process in which La does not mix in between the two superconducting electrodes.

Conventional Josephson junctions that show a standard deviation ($\sigma$) of about 8% among 100 junctions have been made as described above, but these values are not sufficient to integrate over 100 junctions. Thus, there has been a demand for a type of Josephson junction that allows integration of a larger number with less variability in the characteristics.

DISCLOSURE OF THE INVENTION

A first object of the present invention is to provide a Josephson junction, particularly a ramp-edge type Josephson junction and an electronic device provided with the Josephson junction of high performance and high reliability that can be made easily and reliably under film forming conditions with generous margins for error by solving the first problem described above, and further to provide a method of manufacturing the Josephson junction conveniently.

A second object of the present invention is to provide a high temperature superconducting Josephson junction that allows less variations among a plurality of Josephson junctions and enables it to improve the characteristics and reliability of a product that employs the Josephson junction, and to provide a superconducting electronic device that incorporates the high temperature superconducting Josephson junction.

Through research aimed at achieving the first object, the present inventors obtained the following findings.

a) As mentioned before, $YBa_2Cu_3O_y$ is a superconductor material that does not include harmful substances such as Tl and Hg and has relatively low anisotropy, and shows good superconducting properties even when the component Y is completely or partially replaced with one or more elements selected from the group of La, Nd, Sm, Eu, Gd, Dy, Ho, Er, Tm, Yb and Lu. Element Ba may also be completely or partially replaced with Sr or Ca without significantly degrading the superconducting characteristics. Moreover, constituting the superconductor from five or more elements increases the margins for error for the process conditions that allow it to form a c-axis orientation film that is good in all respects including superconductivity, surface flatness and crystallinity, thus making it easier to form the superconductor film having high quality.

b) When the first superconductor and the second superconductor of the Josephson junction are made from superconductor material constituted from the five or more elements while the upper and lower electrodes are made of superconductors of different compositions, RSJ type I-V characteristic can be easily achieved even in a Josephson junction that uses a layer damaged during processing (damaged layer produced when cutting the ramp edge plane of the first superconductor), and a Josephson junction having a large value of IcRn product and high reliability can be obtained.

c) When the barrier layer includes cations with ionic radius, in case of being 6-coordinated with oxygen (O), of 0.0947 nm or larger in a concentration of 35 to 65% in terms of cation atom ratio, perovskite structure that has good affinity with the first and second superconductors is stabilized so as to form a uniform barrier layer. Ionic radius given in this specification is determined by making reference to Shannon's paper (R. D. Shannon, Acta Cryst. A32 (1976) 751).

d) When making a Josephson junction, forming the first superconductor layer and the second superconductor layer with different compositions or controlling the composition of the film, in the past, used to require tedious processes of changing the element source (target) by opening an airtight film forming chamber that has been maintained as a vacuum to the atmosphere every time. In contrast, the Josephson junction can be made more easily with higher efficiency by arranging a plurality of element sources (targets) in the airtight film forming chamber and switching between the plurality of element sources as required without opening the airtight film forming chamber to the atmosphere.

First aspect of the present invention has been conceived on the basis of the findings described above, and provides the Josephson junction, a method of manufacturing the Josephson junction and an electronic device provided with the Josephson junction as follows.

(1) A high temperature superconducting Josephson junction having a barrier layer sandwiched by two superconductors wherein the two superconductors include one or more element selected from a group of Y, La, Nd, Sm, Eu, Gd, Dy, Ho, Er, Tm, Yb and Lu, one or more element selected from a group of Ba, Sr and Ca, and Cu and oxygen (O), so that each of the two superconductor layers includes at least five elements of differing composition from each other.

(2) A method of manufacturing, with physical film forming means, the high temperature superconducting Josephson junction having a barrier layer sandwiched by two superconductors wherein the two superconductors include one or more element selected from a group of Y, La, Nd, Sm, Eu, Gd, Dy, Ho, Er, Tm, Yb and Lu, one or more element selected from a group of Ba, Sr and Ca, and Cu and oxygen (O), wherein a plurality of element sources are disposed in the airtight film forming chamber and the plurality of element sources are switched as required so as to form the upper and lower superconductor layers of different compositions each including at least five elements.

(3) A superconductor device having one or more Josephson junctions described in (1) above.

The barrier layer of the Josephson junction preferably includes cations with ionic radius in the case of being 6-coordinated with oxygen (O), of 0.0947 nm or larger in a concentration of 35 to 65% in terms of cation atom ratio. This causes the perovskite structure that has good affinity with the first and second superconductors to be stabilized so as to form a uniform barrier layer.

The barrier layer is preferably joined with the two superconductors through ramp-edge junction or stacked junction. Structure of the Josephson junction can be materialized in "ramp-edge junction" and "stacked junction".

The superconducting electronic device according to one aspect of the present invention is characterized in that at least one high temperature superconducting Josephson junction according to the first aspect of the present invention is provided therein.

The present invention, as described above, provides a Josephson junction that has high reliability and high performance by properly controlling the composition of the superconductor material, and makes it possible to manufacture a high performance Josephson junction with high efficiency in stable conditions by improving the way elements are supplied when forming the superconductor layers. Now the present invention will be described in detail below together with the operation thereof.

The Josephson junction according to the present invention, particularly the ramp-edge type Josephson junction is made by forming the first superconductor and the second superconductor from a high temperature superconductor material made up of A (one or more element selected from a group of La, Nd, Sm, Eu, Gd, Dy, Ho, Er, Tm, Yb, Lu and Y), B (one or more element selected from a group of Ba, Sr and Ca), Cu and oxygen, while the first superconductors and the second superconductor are constituted from five or more elements and have compositions differing from each other.

The constitution described above increases the degree of freedom with regards to the material so as to make it possible to manufacture the high-quality Josephson junction within the restraints of the film forming apparatus, and makes it easier to control the properties of the Josephson junction.

While there are many factors that affect the quality of superconductor film, composition of the film material is one of the most important factors.

A copper oxide superconductor includes cations of A, Ba and Cu disposed regularly. In case the composition of cations in a film formed from a 4-element copper oxide superconductor is different from the target composition, the disparity in the composition results in a lattice defect in the crystal that constitutes the film, thereby straining the crystal. The strain not only appears on the surface in the form of bulges or dents resulting in impaired surface flatness, but also disturbs the crystal orientation, thus affecting adversely the film properties. Moreover, existence of the disparity in the composition described above also causes the excess component to precipitate on the film surface when forming the film, again impairing the surface flatness of the film and resulting in degradation in the properties.

When the copper oxide superconductor is constituted from five or more elements, a superconductor without impurity included therein can be formed even when the process conditions vary somewhat during formation of the superconductor. This is because the elements other than Cu and oxygen can occupy the element site of each other in the crystal structure.

The above effect will be described in more detail below. If the Josephson junction is made of a 4-element superconductor material, for example $YBa_2Cu_3O_y$, then the ratio of Y to Ba must not be other than 1:2 and deviation of the composition from this ratio immediately materializes in the form of impurity precipitation. In contrast, when the component Y is completely or partially replaced with one or more element selected from the group of La, Nd, Sm, Eu, Gd, Dy, Ho, Er, Tm, Yb and Lu, or element Ba is completely or partially replaced with Sr and/or Ca so as to make a constitution of five or more elements, the only condition to be satisfied is that the total number of atoms of the elements other than Cu and oxygen is equal to the number of Cu atoms. As far as this rather easy condition is satisfied, regular arrangement is attained without causing lattice defects or precipitation of impurity. This means that the degree of freedom in the composition is increased in that some margins are allowed for the proportions of the elements other than Cu and oxygen to deviate. This is an advantage not found in the 4-element superconductor material $YBa_2Cu_3O_y$ where the ratio of Y to Ba must not be other than 1:2.

The greater degree of freedom in the material composition of the superconductor constituted from five or more elements significantly relaxes the restrictions on the film forming conditions, so as to make it possible to manufacture varieties of Josephson junction in order to meet the restraints of the film forming apparatus and the required product characteristics. That is, the film forming conditions can be controlled so as to form a satisfactory c-axis orientation film of superconductor also by constituting the superconductor from five or more elements and adjusting the composition of the superconductor material to clear the restraints of the film forming apparatus. Specifically, when the superconductor is constituted from five or more elements, high-quality Josephson junctions can be manufactured simply by changing the element source (target) of properly controlled composition when forming superconductor thin film, in spite of restraints of the film forming apparatus.

Formation of the second superconductor layer of the Josephson junction, for example, must be carried out under such conditions that do not deteriorate the first superconductor layer that has already been formed. An important parameter with this regard is the substrate temperature (film forming temperature), and it is desired that film forming temperature for the second superconductor layer be lower than that of the first superconductor layer. This requirement can be met without leading to lower performance when the superconductor is constituted from five or more elements. This is because constituting the superconductor from five or more elements allows for a margin of error in controlling the film forming temperature.

The Josephson junction according to the first aspect of the present invention, as described above, can be made with as high a quality as is permitted by the restraints of the film forming apparatus. Properties of the Josephson junction may also be controlled during the process.

Furthermore, multiple-element constitution of the superconductor material that makes the Josephson junction, namely constitution from five or more elements, also has an effect of increasing the IcRn product.

This effect is probably brought about as the value of Rn is increased by the randomness of the lattice that is introduced into the crystal by the multiple-element constitution at a temperature higher than the superconducting transition temperature (Tc).

Also according to the method of manufacturing the Josephson junction of the first aspect of the present invention where the high temperature superconducting Josephson junction is made by a physical film forming process with a plurality of element sources (targets) disposed in the airtight film forming chamber and the plurality of element sources are switched as required so as to form the upper and lower superconductor layers of different compositions each including at least five elements, composition of the thin film can be easily controlled over a wide range without replacing the element sources (targets) in the film forming chamber.

In the prior art, such tedious operations have been required as opening the airtight film forming chamber, that is maintained as a vacuum, to the atmosphere in order to change the element source (target) so as to control the composition of the thin film to be formed, and repeating this changing operation until the optimum composition is found. The invention makes it possible to form the thin film of controlled composition easily without opening the airtight film forming chamber to the atmosphere to change the element source (target), by providing the plurality of element sources (targets) disposed in the airtight film forming chamber and depositing the particles of the elements on a substrate through plasma or laser irradiation while switching the plurality of element sources and making an arrangement for the control of the amount of particles supplied from each element source.

After research aimed at achieving the second object of the present invention described above by improving the stability of quasi-stable phase in the barrier layer, the present inventors reached the following finding. That is, stability can be improved without compromising the characteristics and therefore variability in the characteristics among chips can be restrained when the barrier layer includes one or more elements selected from the group of La, Nd, Sm and Eu, and one or more elements selected from the group of Y, Gd, Dy, Ho, Er, Tm, Yb and Lu, and preferably cations that have ionic radius in case of being 6-coordinated with oxygen being 0.0947 nm or larger are included in a concentration of 35 to 65% in terms of cation atom ratio.

Specifically, the high temperature superconducting Josephson junction according to the second aspect of the present invention is a Josephson junction having a barrier layer sandwiched by two superconductors wherein the superconductors include one or more elements (RE) selected from the group of Y, La, Nd, Sm, Eu, Gd, Dy, Ho, Er, Tm, Yb and Lu, one or more elements (AE) selected from the group of Ba, Sr and Ca, and Cu and oxygen (O), while the barrier layer includes one or more elements (RE1) selected from the group of La, Nd, Sm and Eu, and one or more elements (RE2) selected from the group of Y, Gd, Dy, Ho, Er, Tm, Yb and Lu.

The barrier layer preferably includes cations that have ionic radius in the case of being 6-coordinated with oxygen (O) being 0.0947 nm or larger in a concentration of 35 to 65% in terms of cation atom ratio. This causes the perovskite structure that has good affinity with the first and second superconductors to be stabilized so as to form a uniform barrier layer.

The barrier layer is preferably joined with the two superconductors through a ramp-edge junction or a stacked junction. The structure of the Josephson junction can be formed as a ramp-edge junction or a stacked junction.

The present invention provides a superconducting electronic device that is provided with at least one high temperature superconducting Josephson junction according to the second aspect of the present invention.

Variability in characteristics among chips will be described in more detail below.

Variability in characteristics among chips is generally caused by slight fluctuations in the manufacturing conditions. It is known that the barrier layer in the junction is a very thin layer of quasi-stable phase (J. G. Wen et al., Appl. Phys. Lett. 75, 2470 (1999)).

To reduce the variability in characteristics among Josephson junctions there is no other way than to produce the layer of the unstable quasi-stable phase with good reproducibility in a stable manner. This is such a demanding requirement as to precipitate the non-equilibrium quasi-stable phase in a very thin layer.

Most of research on the high temperature superconducting Josephson junctions have so far been conducted on $YBa_2Cu_3O_y$ used as the superconductor material. Wen et al. determined the composition of the junction as Y:Ba:Cu=30:43:27 through observation of ramp-edge type Josephson junctions made of $YBa_2Cu_3O_y$ with an analytical type transmission electron microscope (J. G. Wen et al., Appl. Phys. Lett. 75, 2470 (1999)).

In the meantime, from research on the phase diagram of Y—Ba—Cu—O system, it has been verified that no stable phase of such a cation atom ratio exists (for example, D. M. DeLeeuw et al., Physica C 152, 39 (1988)).

The barrier layer located at the junction interface is said to be in a crystal phase that has a perovskite structure of thickness as small as about 2 nm. The perovskite structure is represented by chemical formula $ABO_3$, that has such a structure as an atom located at site A (atom A) is surrounded by twelve oxygen atoms and an atom located at site B (atom B) is surrounded by six oxygen atoms. A cation having a relatively large ionic radius occupies site A and a cation having small ionic radius occupies site B.

Now consider a perovskite structure constituted from cations mixed in the proportion of Y:Ba:Cu=30:43:27 and oxygen.

When the ionic radius is considered, it is natural to assume that Ba having a large ionic radius occupies site A and Cu having small ionic radius occupies site B. Consequently, Y that has an intermediate ionic radius somewhere between those of Ba and Cu must be distributed with similar proportions at both sites. To arrange the Y atoms at regular locations requires delicate control of heat treatment process.

It is also very difficult for Y atoms to occupy the 12-coordinate sites, and Y may precipitate in the form of stable phase such as $Y_2O_3$. Precipitation of such a different phase causes degradation in controllability and reliability of the characteristics of Josephson junctions.

In fact, precipitation of $Y_2O_3$ has been confirmed in the interfaces of Josephson junctions that have unsatisfactory characteristics.

One of the robable causes of the precipitation of such a different phase is the shortage of elements having relatively large sizes that can occupy the 12-coordinate sites in the vicinity of the interface.

There is a case where the barrier layer takes on a perovskite structure represented by $Y_{1-x}BaCu_xO_y$ (x<0.5 y≈3) with lattice constant in a range from 0.41 to 0.43 nm. Investigation of the composition by means of analytical type transmission electron microscope revealed that the proportion of Ba:Y+Cu deviated from 1:1. Thus it can easily be assumed that Y atoms that cannot occupy site A would precipitate in the form of $Y_2O_3$.

When electrical neutrality of the material of perovskite structure is assumed, the valence of Ba is +2 and the valence of Y is +3, while mixed valence is not taken in the $Y_{1-x}BaCu_xO_y (=Ba(Y_{1-x}Cu_x)O_y)$; thus, it inevitably results in the valence of Cu being +2 or higher, or the state of oxygen deficiency occurs. In either case, it may be considered to be chemically unstable. Lattice constant of $YBa_2Cu_3O_y$ high-temperature superconductor is a≈b≈c/3≈0.38–0.39 nm, that is less than 0.41–0.43 nm. When these factors are taken into consideration, problem of stability remains in the barrier layer having composition of Y:Ba:Cu=30:43:27 even when it has a perovskite structure of $Y_{1-x}BaCu_xO_y$ having a lattice constant of 0.41 to 0.43 nm.

According to the present invention, in the Josephson junction having the barrier layer sandwiched by two superconductors, since the barrier layer includes one or more elements (RE1) selected from the group of La, Nd, Sm and Eu, and one or more elements (RE2) selected from the group of Y, Gd, Dy, Ho, Er, Tm, Yb and Lu, the element (RE1) that constitutes the barrier layer is, since this element has a relatively large ionic radius among the elements (RE) that constitute the superconductor, it is likely to occupy site A of the perovskite structure. The element (RE2) that constitutes the barrier layer, on the other hand, is likely to occupy site B of the perovskite structure.

Consequently, in $Y_{1-x}BaCu_xO_y (=Ba(Y_{1-x}Cu_x)O_y)$, (x<0.5 y≈3), for example, as part of Ba is replaced with the element (RE1), the element (RE1) takes a valence of +3, thereby increasing the stability of perovskite structure in view of electrical neutrality. Since the element (RE1) has ionic radius smaller than that of Ba, this makes the lattice constant of the perovskite structure smaller thereby improving the lattice matching with the superconductor that has a crystal structure similar to that of $YBa_2Cu_3O_y$.

In the second aspect of the present invention, it is preferable that the two superconductor layers each include five elements and have compositions different from each other. This increases the margins of error for the process conditions that allow it to form a c-axis orientation film that is good in all respects including superconductivity, surface flatness and crystallinity, thus making it easier to form the thin superconductor film that has high quality. In a Josephson junction that uses a layer damaged during processing (damaged layer produced when cutting the ramp edge plane of the first superconductor), too, the I-V characteristic can be easily made to that of RSJ type, and Josephson junctions having a large value of IcRn product and high reliability can be obtained.

BEST MODE FOR CARRYING OUT THE INVENTION

Next, a high temperature superconducting Josephson junctions according to the two aspects of the present invention and a superconducting electronic device provided with both of the junctions will be described below with reference to specific examples.

SPECIFIC EXAMPLE 1

Figure 1:
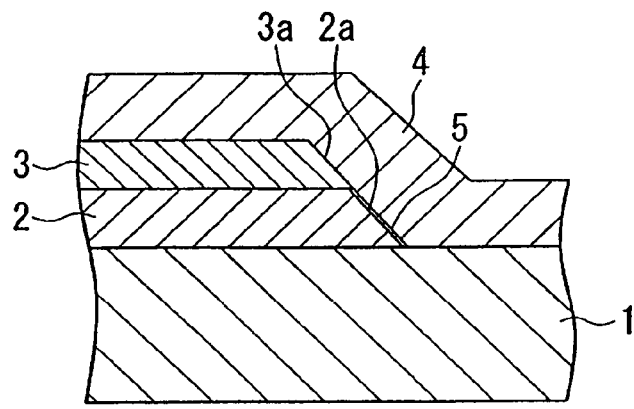
FIG. 1 is a sectional view of a ramp-edge type Josephson junction, illustrating the high temperature superconducting Josephson junction of the ramp-edge type according to the first embodiment of the present invention.

FIG. 1 is a sectional view of a high temperature superconducting Josephson junction of the ramp-edge type according to a first embodiment of the present invention. In the drawing, reference numeral 1 denotes a substrate, 2 denotes a first superconductor, 3 denotes an inter-layer insulation film, 4 denotes a second superconductor and 5 denotes a barrier layer.

The first superconductor 2 is processed at an edge thereof so as to form an edge face 2a inclined by a predetermined angle from the surface of the substrate 1.

Similarly to the first superconductor 2, the inter-layer insulation film 3 is also processed to form an edge face inclined against the substrate 1, namely, an edge face 3a lying in the same plane as the edge face 2a of the first superconductor 2.

The second superconductor 4 is formed so as to cover the first superconductor 2 and the inter-layer insulation film 3 as a whole in the Josephson junction. An extremely thin barrier layer 5 is formed in the interface between the second superconductor 4 and the edge face 2a of the first superconductor 2.

Thus, the ramp-edge type Josephson junction of such a structure is made as the barrier layer 5 is sandwiched by two superconductors 2 and 4.

The substrate 1 is an insulating substrate with an extremely flat surface and is preferably made of an inorganic insulating material such as $(La_{0.3}Sr_{0.7})(Al_{0.65}Ta_{0.35})O_3$, MgO, $SrTiO_3$ (STO), $NdGaO_3$ or $LaAlO_3$.

The first superconductor 2 and the second superconductor 4 are made of copper oxide high temperature superconductor, that is a ceramic material of perovskite structure that includes one or more elements (Re) selected from among the group of Y, La, Nd, Sm, Eu, Gd, Dy, Ho, Er, Tm, Yb and Lu, one or more elements (Ae) selected from the group of Ba, Sr and Ca, and Cu and oxygen (O).

The composition of the first superconductor 2 and the second superconductor 4 are required only to satisfy the requirements described above, and may have the same composition or compositions different from each other.

For the copper oxide high temperature superconductor, for example, $Y_{3-x-y}Ba_xLa_yCu_3O_z$(YBLCO), $YBa_2Cu_3O_z$ (YBCO), $NdBa_2Cu_3O_z$(NdBCO), $YbBa_2Cu_3O_y$(YbBCO), $Yb_{3-x-y}Ba_xLa_yCu_3O_z$ are preferably used. In these formulae, x, y and z take such values that give the valence of copper which results in the most useful superconducting characteristic in the superconductor.

The inter-layer insulation film 3 is made of an insulating material that can insulate between the first superconductor 2 and the second superconductor 4, and such materials are preferably used as $CeO_2$, $(La_{0.3}Sr_{0.7})(Al_{0.65}Ta_{0.35})O_3$, $SrTiO_3$(STO) or $CaSnO_3$.

The barrier layer 5 is an extremely thin layer made of an oxide compound having a composition different from those of the first superconductor 2 and the second superconductor 4 and includes one or more elements (RE1) selected from the group of La, Nd, Sm and Eu, and one or more elements (RE2) selected from the group of Y, Gd, Dy, Ho, Er, Tm, Yb and Lu.

For the oxide compound, for example, $Y_{3-x-y}Ba_xLa_yCu_3O_w$(YBLCO), $(Y, Yb)_{1-x-y-z}Ba_xLa_yCu_2O_w$ or $Nd_{1-x-y-z}Y_xBa_yCu_zO_w$ is preferably used, where x, y, z and w take values that stabilize the crystal structure based on perovskite structure. The barrier layer includes cations with ionic radius in case of being 6-coordinated with oxygen (O) 0.0947 nm or larger in a concentration of 35 to 65% in terms of cation atom ratio, and the oxygen content w is a value that is sufficient to maintain the perovskite structure.

The barrier layer 5 may include alkali metal, transition metal or other elements added by such a technique as artificial barrier.

The barrier layer preferably includes cations that have ionic radius in case of being 6-coordinated with oxygen (O) 0.0947 nm or larger in a concentration of 35 to 65% in terms of cation atom ratio.

Composition of the barrier layer can be quantitatively analyzed by using an analytical type transmission electron microscope with electron beam about 1 nm in diameter or less. Ionic radius given in this embodiment, however, is determined by making reference to Shannon's paper (R. D. Shannon, Acta Cryst. A32 p. 751 (1976)).

Now, a method of manufacturing the ramp-edge type high temperature superconducting Josephson junction of this embodiment will be described below with reference to FIGS. 7A through 7C.

Figure 7A:
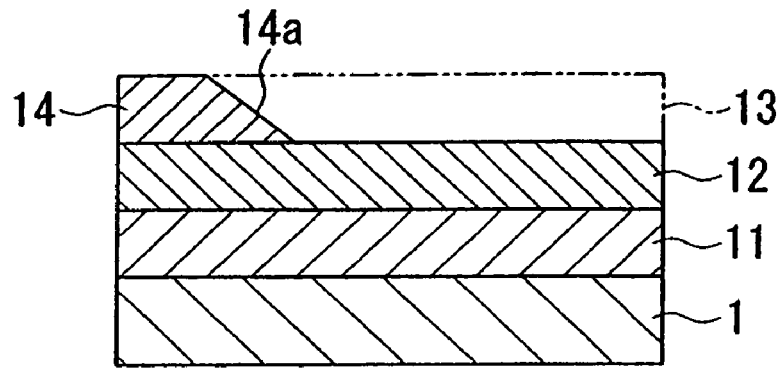
FIGS. 7A through 7C are process diagrams showing a method of manufacturing the ramp-edge type high temperature superconducting Josephson junction according to Specific Example 1 of the present invention.

First, as shown in FIG. 7A, a first superconductor layer 11 and an inter-layer insulation film 12 are formed successively on the substrate 1 by RF sputtering process, CVD process, reactive CVD process or the like, and then a photo-resist layer 13 is formed on the inter-layer insulation film 12 by spin coating process or the like.

Then, the photo-resist layer 13 is patterned by photolithography, and reflow processing is applied to the patterned photo-resist, thereby to form the mask 14 having an edge 14a that is gently inclined.

Figure 7B:
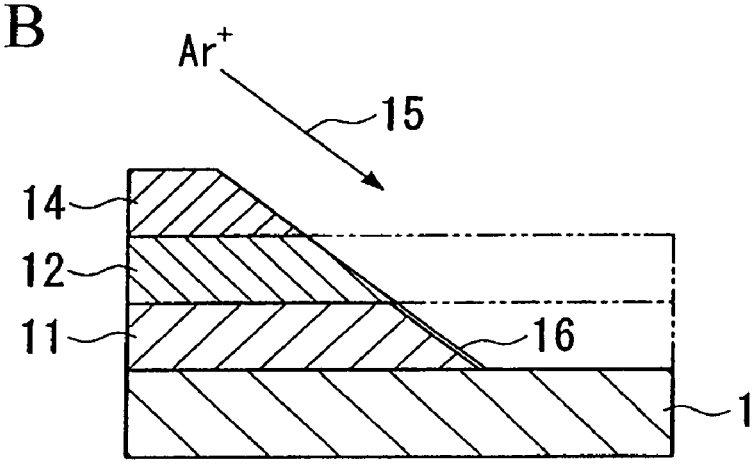

Then, as shown in FIG. 7B, the mask 14 is used to etch the inter-layer insulation film 12 and the first superconductor layer 11 with Ar ion ($Ar^+$) bombardment 15, so as to form gently inclined surfaces at the edges of the inter-layer insulation film 12 and the first superconductor layer 11 of the Josephson junction. Thus the ramp surface of the first superconductor layer 11 is damaged by the Ar ion ($Ar^+$) bombardment 15 to form an extremely thin damaged layer 16. The mask 14 is then removed by means of an ashing apparatus.

Figure 7C:
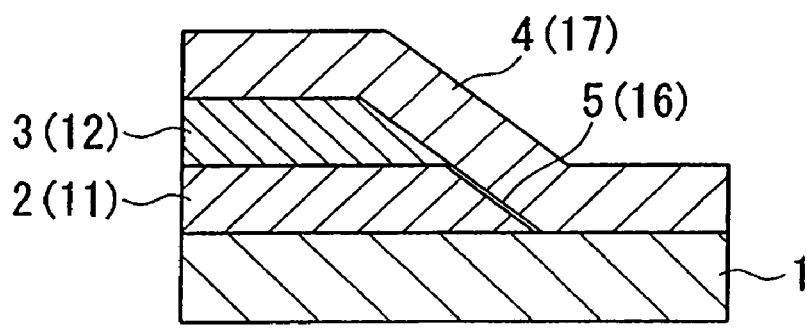

Then, as shown in FIG. 7C, a second superconductor layer 17 is formed on the first superconductor layer 11 and the inter-layer insulation film 12 by laser deposition or the like. As the second superconductor layer 17 is formed, the damaged layer 16 produced on the ramp surface of the first superconductor layer 11 reacts with the first superconductor layer 11 and the second superconductor layer 17, so as to turn into the barrier layer 5.

Lastly, electrodes are formed from an electrically conductive material such as gold (Au) by vapor deposition or sputtering process, at predetermined positions on the first superconductor layer 11 and the second superconductor layer 17.

With the above processes, the ramp-edge type Josephson junction having the extremely thin barrier layer 5 sandwiched between the two superconductors 2 and 4 can be easily made by using the IEJ technique.

In the ramp-edge type high temperature superconducting Josephson junction of this embodiment, since the barrier layer 5 includes one or more elements (RE1) selected from the group of La, Nd, Sm and Eu, and one or more elements (RE2) selected from the group of Y, Gd, Dy, Ho, Er, Tm, Yb and Lu, the element (RE1) is likely to occupy site A and the element (RE2) is likely to occupy site B, so that stability of the barrier layer 5 can be improved.

Also, because the barrier layer 5 includes the element (RE1) and the element (RE2), lattice matching between the barrier layer 5 and the two superconductors 2 and 4 can be improved, thereby producing a more stable Josephson junction.

As a result, a Josephson junction is obtained that shows good RSJ characteristics and allows it to suppress the variability in the critical current Ic and in the IcRn product to an extremely low level.

When a number of ramp-edge type high temperature superconducting Josephson junctions of this embodiment are formed on one chip, a superconducting electronic device having extremely small variance in the critical current Ic and in IcRn product can be made.

SPECIFIC EXAMPLE 2

Figure 2:
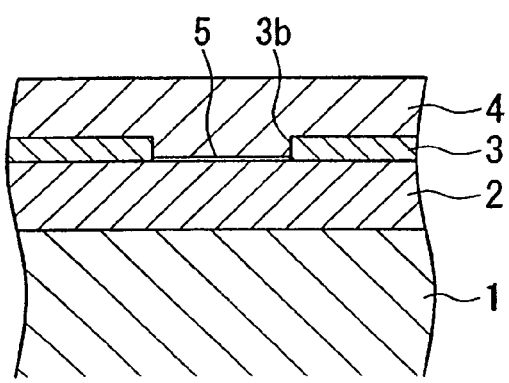
FIG. 2 is a sectional view of a stacked type high temperature superconducting Josephson junction.
Figure 3:
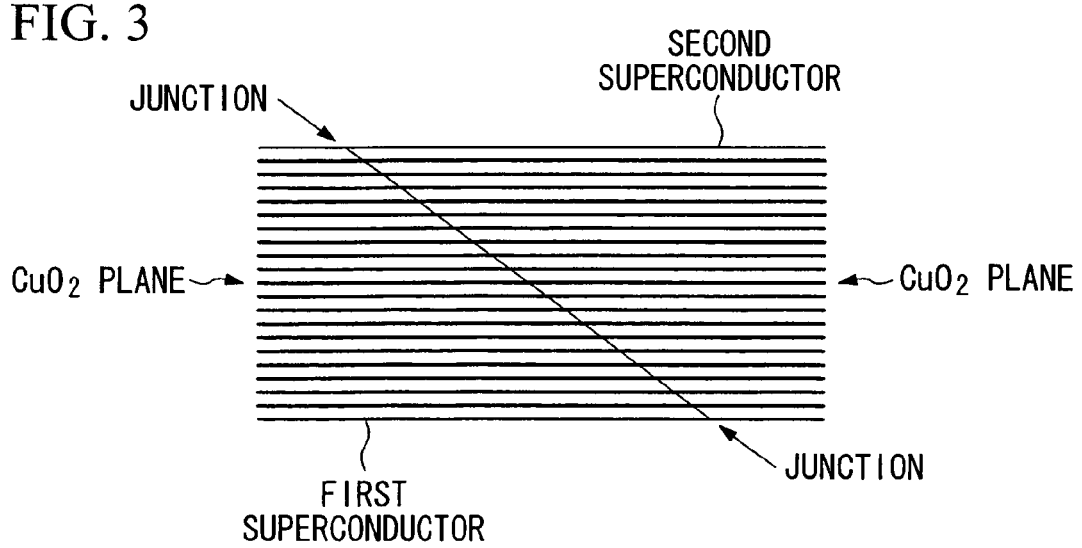
FIG. 3 is a schematic diagram showing the structure of junction according to an example of the ramp-edge type Josephson junction (an example employing the same material for the first and second superconductors).
Figure 4A:
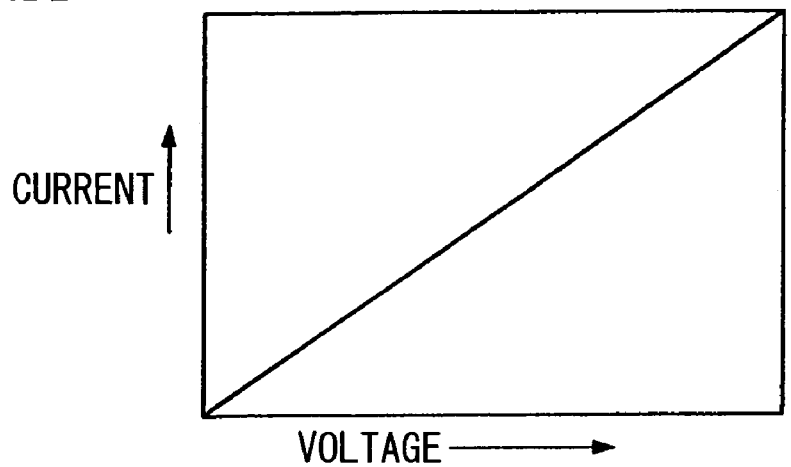
FIG. 4 shows I-V characteristic of a junction, FIG. 4A showing resistive I-V characteristics, FIG. 4B showing RSJ type I-V characteristics, and FIG. 4C showing FF type I-V characteristics.
Figure 4B:
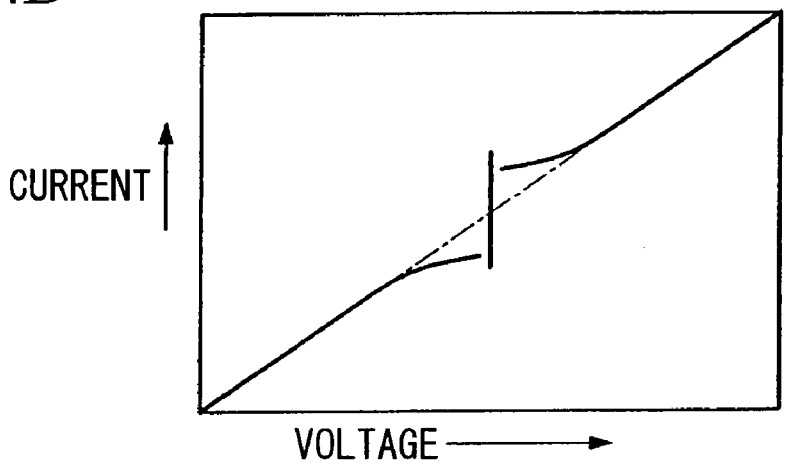
Figure 4C:
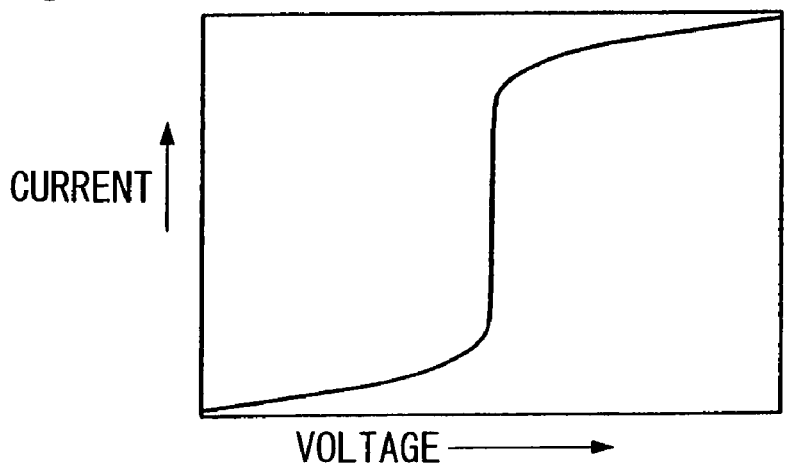
Figure 5:
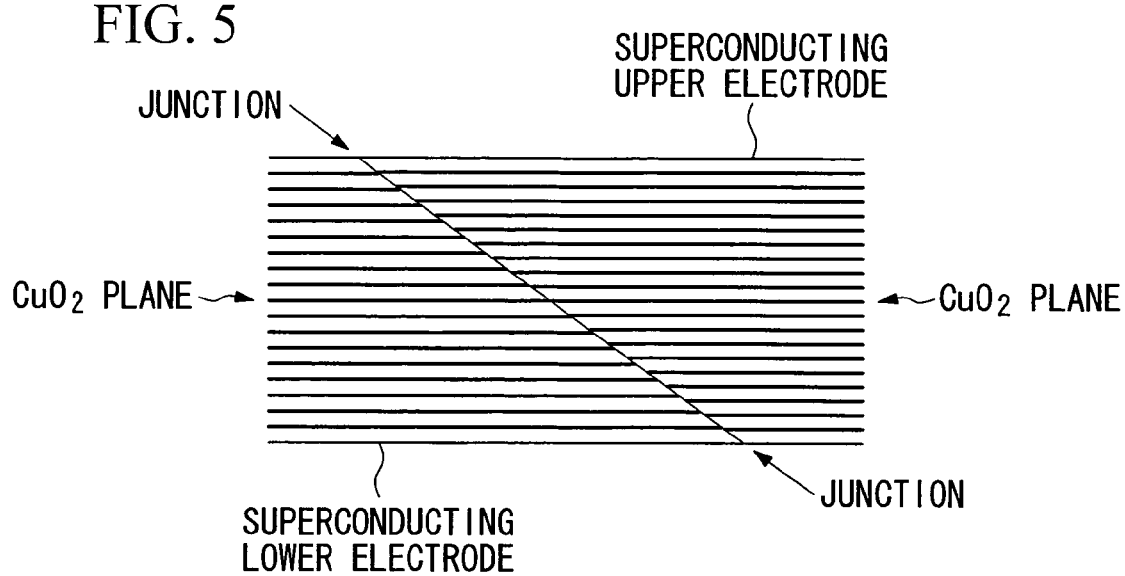
FIG. 5 is a schematic diagram showing the structure of a junction according to an example of the ramp-edge type Josephson junction (an example employing different materials for the first and second superconductors).
Figure 6:
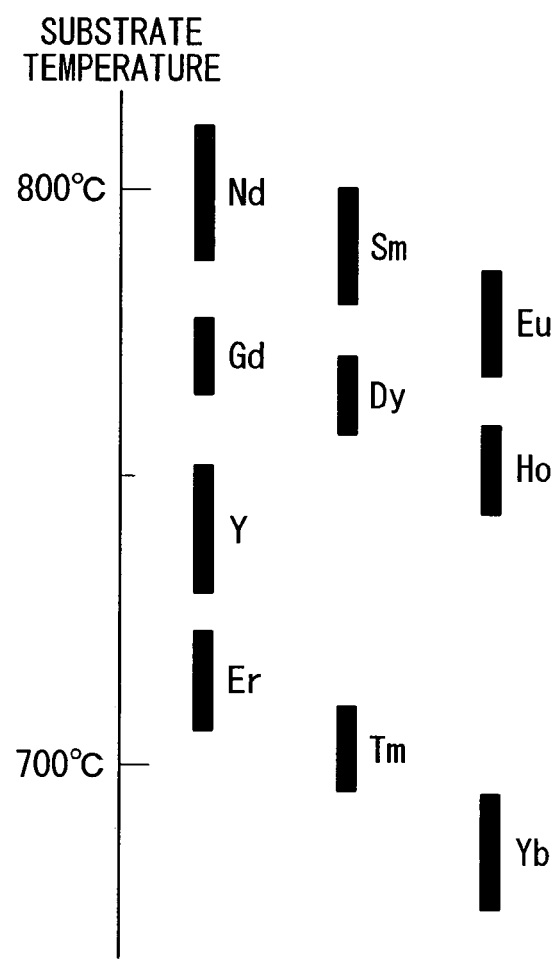
FIG. 6 shows the ranges of substrate temperatures in which c-axis orientation film that has a flat surface can be formed from $LnBa_2Cu_3O_y$ (Ln=Nd, Sm, Eu, Gd, Dy, Ho, Er, Tm, Yb or Y) by an off-axis type high frequency sputtering process.

FIG. 2 is a sectional view of the stacked type high temperature superconducting Josephson junction according to the second embodiment of the present invention. The first superconductor 2 and the inter-layer insulation film 3 are formed successively on the substrate 1, the opening 3b is formed in the inter-layer insulation film 3 at a position where a Josephson junction is to be made, the second superconductor 4 is formed on the inter-layer insulation film 3 and on the first superconductor 2 that is exposed through the opening 3b, and the damaged layer produced by bombarding Ar ions (Ar$^+$) on the surface of the first superconductor 2 that is exposed through the opening 3b reacts with the first superconductor 2 and the second superconductor 4 so as to turn into the extremely thin barrier layer 5.

Thus, the Josephson junction of this embodiment has a structure different from that of the Josephson junction of the first embodiment described previously.

The Josephson junction of this embodiment can be easily made by an IEJ technique similarly to the Josephson junction of the first embodiment.

The stacked type high temperature superconducting Josephson junction of this embodiment can also achieve exactly the same effect as that of the ramp-edge type high temperature superconducting Josephson junction of the first embodiment.

EXAMPLES

Now the present invention will be described below by way of Examples and Comparative Examples. It should be understood that the present invention is not limited by these Examples.

1. Ramp-Edge Type High Temperature Superconducting Josephson Junction

Example 1

In this example, the Josephson junction is of an IEJ type wherein the layer damaged during processing is used as the junction, as shown in FIG. 1, while formation of such a ramp-edge type Josephson junction was attempted as the variance (σ/X) was restrained within 10% and critical current Ic is 1.0 mA or higher (4.2K). 25 Pieces of the device were made for each test.

<Comparative Test>

As examples of the prior art, devices having the first superconductor and the second superconductor made of $YBa_2Cu_3O_y$ (hereinafter, y that represents the proportion of oxygen atoms in the formula takes a value that satisfies the requirement of the formula concerning the valence) were manufactured.

$(La,Sr)_2AlTaO_6$ (LSAT) (100) was used for the substrate over which $YBa_2Cu_3O_y$ film was formed to a thickness of 200 nm by off-axis high frequency sputtering process for the first superconductor.

A c-axis orientation film having a flat surface was formed by setting the substrate temperature to 750° C., high frequency power output to 50 W and pressure of ambient gas (Ar:$O_2$=9:1) to 120 mTorr. Surface roughness of 4.3 nm was measured with an atomic force microscope (AFM).

Then the inter-layer insulation film of $(La,Sr)_2AlTaO_6$ (LSAT) was formed to a thickness of 200 nm under the same conditions on the first superconductor made of $YBa_2Cu_3O_y$.

With a resist film being placed on the 2-layer film formed as described above, patterning was carried out by photolithography, and the ramp surface of the first superconductor was formed by applying Ar ion bombardment (acceleration voltage 500 V) at an angle of 30°.

The second superconductor made of $YBa_2Cu_3O_y$ was formed to a thickness of 200 nm by laser deposition.

When forming the second superconductor, oxygen was introduced at a pressure of 200 mTorr and the $YBa_2Cu_3O_y$ target having stoichiometrical composition was irradiated with laser beam of 400 mJ output. Energy density of the laser beam on the target was 1.5 J/cm$^2$.

The junction made under the conditions of 60 mm for the distance between the substrate and the target and 690 to 710° C. for the substrate temperature (film forming temperature) showed RSJ type I-V characteristic at 4.2K.

I-V characteristic, Ic and IcRn product measured on ramp-edge type Josephson junctions made with different film forming temperatures (substrate temperatures) for the second superconductor are shown in Table 1.

TABLE 1

| Second superconductor layer forming temperature (° C.) | I-V characteristic | Critical current Ic (mA) | IcRn (mV) |
|---|---|---|---|
| 740 | FF | — | — |
| 730 | FF | — | — |

TABLE 1-continued

| Second superconductor layer forming temperature (° C.) | I-V characteristic | Critical current Ic (mA) | IcRn (mV) |
|---|---|---|---|
| 720 | FF | — | — |
| 710 | RSJ | 0.9 | 2.0 |
| 700 | RSJ | 0.7 | 1.8 |
| 690 | RSJ | 0.6 | 1.7 |
| 680 | Resistor | — | — |

An attempt to make a junction having an Ic of 1.0 mA or higher with the above technique field.

Accordingly, instead of $YBa_2Cu_3O_y$ superconductor, $YBa_{1.7}Sr_{0.3}Cu_3O_y$ superconductor, with part of Ba in the former replaced with Sr, was used as the second superconductor.

Research on ceramic materials have shown that partial replacement of Ba with Sr makes the melting point of the material slightly higher and causes superconducting transition temperature (Tc) to decreas by only a few degrees K. Use of $YBa_{1.7}Sr_{0.3}Cu_3O_y$ superconductor enables it to raise the film forming temperature (substrate temperature) when forming the second superconductor.

When the second superconductor was formed from $YBa_{1.7}Sr_{0.3}Cu_3O_y$ superconductor by laser deposition, c-axis orientation film was obtained when the substrate temperature (film forming temperature) was in a range from 700 to 730° C.

I-V characteristic, Ic and IcRn product measured on the ramp-edge type Josephson junctions made with the above materials used for the second superconductor are shown in Table 2.

TABLE 2

| Second superconductor layer forming temperature (° C.) | I-V characteristic | Critical current Ic (mA) | IcRn (mV) |
|---|---|---|---|
| 740 | FF | — | — |
| 730 | RSJ | 1.0 | 2.0 |
| 720 | RSJ | 1.1 | 2.1 |
| 710 | RSJ | 0.8 | 2.0 |
| 700 | RSJ | 0.6 | 1.3 |
| 690 | Resistor | — | — |
| 680 | Resistor | — | — |

As will be seen from Table 2, a junction having Ic≧1.0 mA was obtained with the technique described above when the film forming temperature (substrate temperature) was from 720 to 730° C.

However, measurements of critical current Ic of 25 pieces of junction that have been manufactured and calculation of mean value (X) and standard deviation (σ) showed the variance (σ/X) in the critical current was 14%.

Example Tests

In order to reduce the variance in Ic, the process of forming the Josephson junction was closely examined. Microscopic bumps were observed with atomic force microscope (AFM) on the surface of the first superconductor made of $YBa_2Cu_3O_y$.

Assuming that the variance in Ic was caused by the bumps in the first superconductor, attempts were made to improve the surface flatness of the first superconductor.

X-ray diffraction (XRD) pattern obtained by scanning over a range from θ to 2θ with CuK α revealed that the first superconductor made of $YBa_2Cu_3O_y$ showed mostly 001 reflection indicating c-axis orientation, although enlarging the diffraction pattern revealed a weak and broad peak of impurity near 2θ=44°.

This was attributed to the precipitation of impurity due to a deviation in the composition.

Accordingly, feasibility was examined as to forming the first superconductor from $Y_{0.9}Ba_{1.9}La_{0.2}Cu_3O_y$ made by replacing Y and Ba in $YBa_2Cu_3O_y$ with a small amount of La that can partially substitute the atomic sites of both Y and Ba.

A $Y_{0.9}Ba_{1.9}La_{0.2}Cu_3O_y$ film was formed to a thickness of 200 nm for the first superconductor on the substrate by off-axis high frequency sputtering process. A c-axis orientation film having flat surface was obtained when the substrate temperature was 750° C.

When observed with an atomic force microscope (AFM), surface roughness Ra of the first superconductor layer showed an improvement to 2.3 nm, and the microscopic bumps formed on the $YBa_2Cu_3O_y$ film was not observed. The peak of impurity also disappeared from the X-ray diffraction pattern.

These improvements in the film quality are supposedly brought about by the increasing degree of freedom in the composition as Y and Ba in $YBa_2Cu_3O_y$ were partially replaced with La so as to make a 5-element material.

The inter-layer insulation film of $(La,Sr)_2AlTaO_6(LSAT)$ was formed to a thickness of 200 nm with a technique similar to that of the comparative test on the first superconductor layer made of $Y_{0.9}Ba_{1.9}La_{0.2}Cu_3O_y$ that was formed as described above. With a resist film placed on the 2-layer film formed as described above, patterning was carried out by photolithography, and the ramp surface of the first superconductor was formed by applying Ar ion bombardment (acceleration voltage 500 V) at an angle of 30°.

Then ramp-edge type Josephson junction was completed by forming a $YBa_{1.7}Sr_{0.3}Cu_3O_y$ film to a thickness of 200 nm by laser deposition (substrate temperature 720° C.) for the second superconductor.

Performance tests on 25 pieces of the ramp-edge type Josephson junction showed that junctions having Ic of 1.2 mA were obtained with variance (σ/X) of 9%.

Example 2

In this example, it was attempted to manufacture ramp-edge type Josephson junctions of the IEJ type wherein a damaged layer produced during processing is used as the junction, with critical current Ic of about 0.4 mA (4.2K) and variance (σ/X) of 10% or less. 25 Pieces of device were made for each test.

<Comparative Test>

When ramp-edge type Josephson junctions were manufactured with a technique similar to that of Example 1, with the first superconductor made of $Y_{0.9}Ba_{1.9}La_{0.2}Cu_3O_y$ described in Example 1 and the second superconductor made of $YBa_2Cu_3O_y$, it was difficult to achieve an Ic below 0.6 mA.

The value of Ic tended to decrease when the temperature of forming the second superconductor was reduced, similarly as shown by the data of Table 1 for Example 1. For this reason, the $YBa_2Cu_3O_y$ film for the second superconductor was formed at 680° C., hoping to achieve an Ic of 0.5 mA. However, a resistor resulted instead of a Josephson junction.

Then, the second superconductor was made from a thin $YbBa_2Cu_3O_y$ film that allows it to form a c-axis orientation film at a lower temperature than in the case of $YBa_2Cu_3O_y$, and the c-axis orientation film was obtained when the substrate temperature (film forming temperature) was in a range from 650 to 680° C.

I-V characteristic, Ic and IcRn product measured on the ramp-edge type Josephson junctions made with the above materials used for the second superconductor are shown in Table 3.

TABLE 3

| Second superconductor layer forming temperature (° C.) | I-V characteristic | Critical current Ic (mA) | IcRn (mV) |
| --- | --- | --- | --- |
| 690 | FF | — | — |
| 680 | FF | — | — |
| 670 | RSJ | 0.4 | 1.7 |
| 660 | RSJ | 0.2 | 1.4 |
| 650 | Resistor | — | — |

As will be seen from Table 3, a junction having Ic=0.4 mA was obtained with the technique described above when the substrate temperature (film forming temperature) was 670° C., thus achieving the target value. However, evaluation of the 25 pieces of junction that have been manufactured showed variance (σ/X) of 18% in the value of Ic.

Example Test

In order to reduce the variance in Ic, the process of forming the Josephson junction was closely examined. Although the X-ray diffraction analysis of the $YBa_2Cu_3O_y$ film of the second superconductor showed c-axis orientation, observation with an optical microscope revealed that the surface was very rough so that contrast could easily be obtained.

Accordingly, on assumption that the variance in Ic mentioned above was caused by the rough surface of the second superconductor while the surface roughness, in turn, was caused by a deviation in the composition of the $YbBa_2Cu_3O_y$ film, the second superconductor layer was formed from $Yb_{0.9}Ba_{1.9}Nd_{0.2}Cu_3O_y$ made by replacing Yb and Ba in $YbBa_2Cu_3O_y$ with a small amount of Nd that can partially substitute the atomic sites of both Yb and Ba, by laser deposition at the substrate temperature (film forming temperature) of 670° C.

This resulted in the second superconductor layer having c-axis orientation with fairly improved surface flatness. This improvement was supposedly brought about by the increasing degree of freedom in the composition as Yb and Ba in $YbBa_2Cu_3O_y$ were partially replaced with Nd so as to make a 5-element material.

Performance tests on the 25 pieces of the ramp-edge type Josephson junction having the first superconductor made of $Y_{0.9}Ba_{1.9}La_{0.2}Cu_3O_y$ and the second superconductor made of $Yb_{0.9}Ba_{1.9}Nd_{0.2}Cu_3O_y$ manufactured as described above showed that junctions having Ic of 0.4 mA were obtained with variance (σ/X) of 10%.

Example 3

In this example, ramp-edge type Josephson junctions having critical current Ic of 0.5 mA, 1.0 mA, 1.5 mA and 2.0 mA at 4.2K with variance (σ/X) of 15% or less were manufactured, the Josephson junction being of the IEJ type wherein a damaged layer produced during processing is used as the junction. Here again 25 pieces of device were manufactured for each test.

Tests for Example 1 and Example 2s were conducted in the conventional manner, but it is very tedious to open the airtight film forming chamber (vacuum chamber) to the atmosphere and replace the target material, in order to achieve the target characteristics.

To eliminate the tedious operation, a laser deposition film forming apparatus that allows three targets to be mounted in the vacuum chamber was used.

$SmBa_2Cu_3O_y$, $YBa_2Cu_3O_y$ and $YbBa_2Cu_3O_y$ were used for the three target materials, and it was attempted to form a superconductor film of solid solution system by depositing these materials on the substrate in an appropriate sequence with an appropriate number of cycles.

Figure 8:
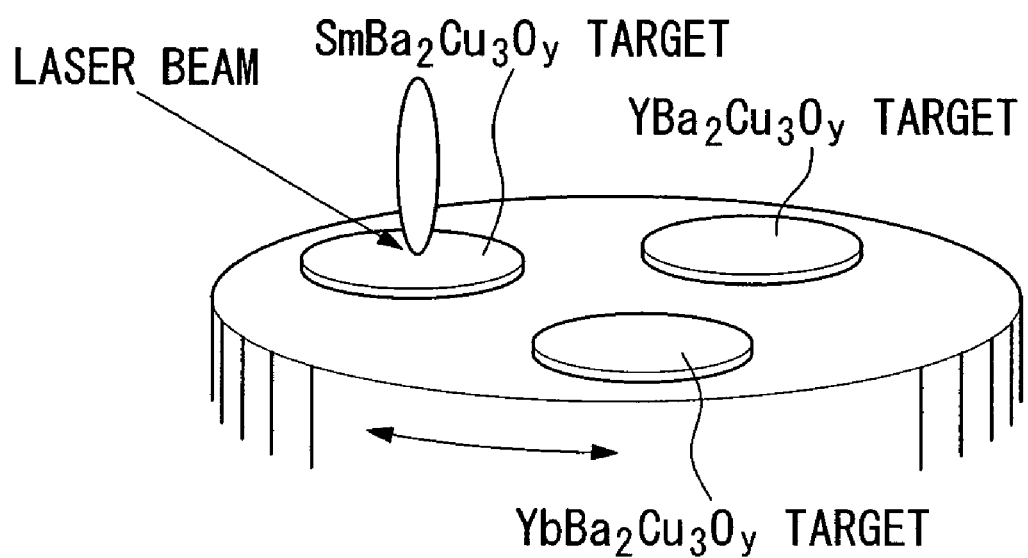
FIG. 8 schematically shows a target stage of a laser deposition apparatus that allows a plurality of target materials to be mounted thereon used in an embodiment.

FIG. 8 schematically shows the target stage of the laser deposition film forming apparatus used in the example.

Placed on the target stage are three target materials of $SmBa_2Cu_3O_y$, $YBa_2Cu_3O_y$ and $YbBa_2Cu_3O_y$, the target stage being rotated so as to select the target material to be irradiated with a laser beam and to control the duration and the number of irradiations, thereby to control the composition of the superconductor film of solid solution system to be formed on the substrate. This control over the composition of the superconductor film to be formed also enables it to control the substrate temperature that allows it to yield a c-axis orientation film that has a flat surface.

It was attempted to manufacture ramp-edge type Josephson junctions having the second superconductor layer made of $(Y, Yb)Ba_2Cu_3O_y$ and the first superconductor layer made of $(Sm, Y)Ba_2Cu_3O_y$.

The film forming temperature (substrate temperature) at which the c-axis orientation film can be made by laser deposition is from 750 to 780° C. for $SmBa_2Cu_3O_y$, from 700 to 730° C. for $YBa_2Cu_3O_y$, and from 650 to 680° C. for $YbBa_2Cu_3O_y$, and therefore the c-axis orientation film can be made at a temperature in a range from 700 to 780° C. for $(Sm, Y)Ba_2Cu_3O_y$, and from 650 to 730° C. for $(Y, Yb)Ba_2Cu_3O_y$.

Accordingly, the ramp-edge type Josephson junctions having various combinations of the second superconductor layer and the first superconductor layer of different compositions were manufactured by placing the three kinds of target material in the vacuum chamber of the film forming apparatus, while setting the film forming temperature (substrate temperature) from 700 to 780° C. when forming the first superconductor layer, and setting the film forming temperature (substrate temperature) from 650 to 730° C. when forming the second superconductor layer without opening the vacuum chamber to the atmosphere and changing the target material.

Thus the ramp-edge type Josephson junctions having various characteristics as shown in Table 4 were manufactured. In the column of superconductor composition in Table 4, proportion of Ln in the material $LnBa_2Cu_3O_y$ used in the superconductor is indicated.

TABLE 4

| Test No. | Composition of first superconductor/film forming temperature (° C.) | Composition of second superconductor/film forming temperature (° C.) | Critical current Ic (mA) | Variance of Ic (σ/X) (%) | IcRn product (mV) |
|---|---|---|---|---|---|
| 1 | $Sm_{0.8}$—$Y_{0.2}$/770 | $Y_{0.8}$—$Yb_{0.2}$/720 | 2.4 | 8 | 3.2 |
| 2 | $Sm_{0.7}$—$Y_{0.3}$/760 | $Y_{0.8}$—$Yb_{0.2}$/720 | 2.3 | 8 | 2.6 |
| 3 | $Sm_{0.6}$—$Y_{0.4}$/750 | $Y_{0.8}$—$Yb_{0.2}$/720 | 2.0 | 9 | 2.6 |
| 4 | $Sm_{0.5}$—$Y_{0.5}$/770 | $Y_{0.8}$—$Yb_{0.2}$/720 | 1.8 | 9 | 2.2 |
| 5 | $Sm_{0.4}$—$Y_{0.6}$/730 | $Y_{0.8}$—$Yb_{0.2}$/720 | 1.8 | 9 | 2.1 |
| 6 | $Sm_{0.3}$—$Y_{0.7}$/720 | $Y_{0.8}$—$Yb_{0.2}$/720 | 1.7 | 10 | 1.9 |
| 7 | $Sm_{0.2}$—$Y_{0.8}$/710 | $Y_{0.8}$—$Yb_{0.2}$/720 | 1.5 | 12 | 1.8 |
| 8 | $Sm_{0.8}$—$Y_{0.2}$/770 | $Y_{0.5}$—$Yb_{0.5}$/690 | 1.4 | 10 | 3.6 |
| 9 | $Sm_{0.7}$—$Y_{0.3}$/760 | $Y_{0.5}$—$Yb_{0.5}$/690 | 1.2 | 11 | 3.7 |
| 10 | $Sm_{0.6}$—$Y_{0.4}$/750 | $Y_{0.5}$—$Yb_{0.5}$/690 | 1.0 | 8 | 3.0 |
| 11 | $Sm_{0.5}$—$Y_{0.5}$/770 | $Y_{0.5}$—$Yb_{0.5}$/690 | 0.9 | 9 | 2.7 |
| 12 | $Sm_{0.4}$—$Y_{0.6}$/730 | $Y_{0.5}$—$Yb_{0.5}$/690 | 0.8 | 9 | 2.4 |
| 13 | $Sm_{0.3}$—$Y_{0.7}$/720 | $Y_{0.5}$—$Yb_{0.5}$/690 | 0.8 | 13 | 2.2 |
| 14 | $Sm_{0.2}$—$Y_{0.8}$/710 | $Y_{0.5}$—$Yb_{0.5}$/690 | 0.7 | 12 | 2.1 |
| 15 | $Sm_{0.8}$—$Y_{0.2}$/770 | $Y_{0.2}$—$Yb_{0.8}$/660 | 1.1 | 10 | 3.9 |
| 16 | $Sm_{0.7}$—$Y_{0.3}$/760 | $Y_{0.2}$—$Yb_{0.8}$/660 | 1.2 | 9 | 3.8 |
| 17 | $Sm_{0.6}$—$Y_{0.4}$/750 | $Y_{0.2}$—$Yb_{0.8}$/660 | 0.6 | 9 | 2.9 |
| 18 | $Sm_{0.5}$—$Y_{0.5}$/770 | $Y_{0.2}$—$Yb_{0.8}$/660 | 0.7 | 11 | 3.1 |
| 19 | $Sm_{0.4}$—$Y_{0.6}$/730 | $Y_{0.2}$—$Yb_{0.8}$/660 | 0.5 | 9 | 2.9 |
| 20 | $Sm_{0.3}$—$Y_{0.7}$/720 | $Y_{0.2}$—$Yb_{0.8}$/660 | 0.3 | 14 | 2.4 |
| 21 | $Sm_{0.2}$—$Y_{0.8}$/710 | $Y_{0.2}$—$Yb_{0.8}$/660 | 0.4 | 13 | 2.4 |

From the data shown in Table 4, it can be seen that IcRn product becomes larger as the difference in mean ionic radius of Ln in the superconductor material $LnBa_2Cu_3O_y$ between the second superconductor layer and the first superconductor layer is larger, and that Ic becomes higher when the temperatures of forming the second superconductor layer and the first superconductor layer are higher.

Junctions having critical current Ic of 0.5 mA, 1.0 mA, 1.5 mA and 2.0 mA are represented by tests Nos. 19, 10, 7 and 3.

While junctions having critical current Ic of 0.7 mA are represented by tests Nos. 14 and 18, they have different values of IcRn, namely, 2.1 mV and 3.1 mV. This means that junctions having different values of IcRn can be made even when Ic is the same, by changing Ln.

Example 4

In this example, the Josephson junctions are of the IEJ type wherein the layer damaged during processing is used as the junction, while formation of ramp-edge type Josephson junctions having the same critical current Ic of about 1.0 mA (4.2K) but different values of IcRn was attempted.

The junction device comprising the second superconductor and the first superconductor made of $YBa_{1.7}Sr_{0.3}Cu_3O_y$ and $Y_{0.9}Ba_{1.9}Sr_{0.2}Cu_3O_y$ respectively, manufactured in Example 1 showed critical current Ic of 1.2 mA and IcRn product of 2.2 mV. Here, it was attempted to manufacture ramp-edge type Josephson junctions with the second superconductor changed to a multiple-component material of $Gd_{0.5}Tm_{0.5}Ba_{1.7}Sr_{0.3}Cu_3O_y$ or $Eu_{0.5}Lu_{0.5}Ba_{1.7}Sr_{0.3}Cu_3O_y$.

Mean ionic radius of Gd and Tm and mean ionic radius of Eu and Lu are similar to the ionic radius of Y.

In an attempt to form thin films of $YBa_{1.7}Sr_{0.3}Cu_3O_y$, $Gd_{0.5}Tm_{0.5}Ba_{1.7}Sr_{0.3}Cu_3O_y$ and $Eu_{0.5}Lu_{0.5}Ba_{1.7}Sr_{0.3}Cu_3O_y$ by laser deposition, a c-axis orientation film was formed when the film forming temperature (substrate temperature) was from 700 to 730° C. in all cases. Accordingly, the second superconductor layer was formed from these materials in this temperature range.

Characteristics of the Josephson junctions thus manufactured are shown in Table 5.

TABLE 5

| Composition of second superconductor | Second superconductor layer forming temperature (° C.) | Critical current Ic (mA) | Variance of Ic (σ/X) (%) | IcRn product (mV) |
|---|---|---|---|---|
| $YBa_{1.7}Sr_{0.3}Cu_3O_y$ | 720 | 1.2 | 9 | 2.2 |
| $Gd_{0.5}Tm_{0.5}Ba_{1.7}Sr_{0.3}Cu_3O_y$ | 730 | 2.3 | 6 | 3.0 |
| $Gd_{0.5}Tm_{0.5}Ba_{1.7}Sr_{0.3}Cu_3O_y$ | 720 | 1.2 | 10 | 2.7 |
| $Gd_{0.5}Tm_{0.5}Ba_{1.7}Sr_{0.3}Cu_3O_y$ | 710 | 0.8 | 11 | 2.0 |
| $Gd_{0.5}Tm_{0.5}Ba_{1.7}Sr_{0.3}Cu_3O_y$ | 700 | 0.3 | 15 | 1.6 |
| $Eu_{0.5}Lu_{0.5}Ba_{1.7}Sr_{0.3}Cu_3O_y$ | 730 | 2.9 | 8 | 3.6 |
| $Eu_{0.5}Lu_{0.5}Ba_{1.7}Sr_{0.3}Cu_3O_y$ | 720 | 1.2 | 9 | 3.1 |
| $Eu_{0.5}Lu_{0.5}Ba_{1.7}Sr_{0.3}Cu_3O_y$ | 710 | 0.9 | 12 | 2.6 |
| $Eu_{0.5}Lu_{0.5}Ba_{1.7}Sr_{0.3}Cu_3O_y$ | 700 | 0.4 | 15 | 2.0 |

Data of Table 5 shows that the Josephson junctions having the second superconductor made from $YBa_{1.7}Sr_{0.3}Cu_3O_y$, $Gd_{0.5}Tm_{0.5}Ba_{1.7}Sr_{0.3}Cu_3O_y$ and $Eu_{0.5}Lu_{0.5}Ba_{1.7}Sr_{0.3}Cu_3O_y$ at the film forming temperature (substrate temperature) of 720° C. have IcRn product of 2.2 mV, 2.7 mV and 3.1 mV, respectively.

This means that use of a material constituted from five or more elements that have ionic radii significantly different from each other makes it possible to independently control the IcRn product of the ramp-edge type Josephson junction.

Example 5

Ramp-edge type Josephson junction was manufactured by using $Y_{0.9}Ba_{1.9}La_{0.2}Cu_3O_y$ for the first superconductor, $Y_{0.95}Ba_{1.95}La_{0.1}Cu_3O_y$ for the second superconductor and $(La_{0.3}Sr_{0.7})(Al_{0.65}Ta_{0.35})O_3$ (hereinafter referred to as LSAT) for the substrate by using the IEJ technique.

First, the first superconductor was formed on a LSAT substrate by the off-axis high frequency sputtering process, and an inter-layer insulation film of LSAT was formed thereon, both to thicknesses of 200 nm. Then, the inter-layer insulation film was coated with photo-resist by a spin coating process, with the photo-resist film being patterned by photolithography, and reflow process was applied so as to form a gentle slope at the edge. Then, the inter-layer insulation film and the first superconductor were etched by Ar ions applied with acceleration voltage of 400 V and ion current 50 mA. Bombardment of Ar ions was carried out while rotating the substrate with the ion beam inclined by 30° from the substrate surface.

As a result, a gentle slope was formed on the inter-layer insulation film and the first superconductor. The sloped surface was covered with a damage layer caused by Ar ion bombardment. With the remaining resist being removed by means of an ashing apparatus, the second superconductor was formed on the inter-layer insulation film and the first superconductor by laser deposition process. The samples of Example 1 were made by further depositing gold (Au) and forming an electrode of predetermined shape through proper patterning.

Ten Josephson junctions formed on the substrate all showed I-V characteristics of the RSJ type. These Josephson junctions also showed an IcRn product in a range from 2.1 to 2.6 mV at 4.2K, and critical current Ic of about 0.9 mA. Upon measurement of critical current Ic of 100 Josephson junctions connected in series on the same substrate and calculation of the mean value (X) and standard deviation (σ) thereof, the critical current Ic showed variance (σ/X) of 7.0%.

Observation of the barrier layer with an analytical type transmission electron microscope having an electron beam of about 1 nm diameter showed that thickness of the barrier layer was 1 nm or less at most points. Composition analysis of the barrier layer at 20 points by means of the analytical type transmission electron microscope showed that Y:Ba:La:Cu=19:39:12:30. Atoms having ionic radius in the case of being 6-coordinated with oxygen of 0.0947 nm or larger were Ba and La which accounted for 51% in terms of cation atom ratio.

Comparative Example 1

Ramp-edge type Josephson junctions were manufactured by the IEJ technique using $YBa_2Cu_3O_y$ for the first superconductor and the second superconductor.

First, the first superconductor layer was formed on a LSAT substrate and an inter-layer insulation film of LSAT was formed thereon, both to thicknesses of 200 nm, by the off-axis high frequency sputtering process. Then, gentle slopes were formed on the inter-layer insulation film and the first superconductor layer similarly to Example 1, and second superconductor layer was formed thereon.

Ten Josephson junctions formed on the substrate all showed I-V characteristics of the RSJ type. These Josephson junctions also showed IcRn products in a range from 2.0 to 2.4 mV at 4.2K, and critical current Ic of about 0.8 mA. Upon measurement of critical current Ic of 100 Josephson junctions connected in series on a substrate, the critical current Ic showed variance (σ/X) of 9.7%.

Observation of the barrier layer with an analytical type transmission electron microscope having an electron beam of about 1 nm showed that thickness was 1 nm or less at most points. Composition analysis of the barrier layer at 20 points by means of the analytical type transmission electron microscope showed the composition which was Y:Ba:Cu=30:41:29. La content in the barrier layer was below the detection limit, and no significant inclusion was confirmed. Also, portions having thickness of 3 nm or more with disturbed lattice were found throughout the barrier layer. Composition analysis of such portions revealed the precipitation of $Y_2O_3$ and $Y_2Ba_2O_5$. Frequency at which the precipitation appeared was higher than in Example 1.

Example 6

Ramp-edge type Josephson junctions were manufactured by using $Y_{0.9}Ba_{1.9}La_{0.2}Cu_3O_y$ for the first superconductor and $Yb_{0.9}Ba_{1.9}La_{0.2}Cu_3O_y$ for the second superconductor by using the IEJ technique. The substrate was made of MgO and the inter-layer insulation film was made of $CeO_2$.

Ten Josephson junctions formed on the substrate all showed I-V characteristics of the RSJ type. These Josephson junctions also showed IcRn products in a range from 2.1 to 2.5 mV at 4.2K, and critical current Ic of about 0.9 mA. Upon measurement of critical current Ic of 100 Josephson junctions connected in series on a substrate, the critical current Ic showed variance (σ/X) of 6.8%.

Observation of the barrier layer with analytical type transmission electron microscope similarly to Example 5 showed that the thickness was 1 nm or less at most points, and composition of (Y+Yb):Ba:La:Cu=20:38:10:32. Atoms having ionic radius in the case of being 6-coordinated with oxygen of 0.0947 nm or larger were Ba and La which accounted for 48% in terms of cation atom ratio.

Comparative Example 2

Ramp-edge type Josephson junction was manufactured by the IEJ technique similarly to Example 6, except for using $YBa_2Cu_3O_y$ that does not include La for the first superconductor.

Ten Josephson junctions formed on the substrate all showed I-V characteristics of the RSJ type. These Josephson junctions also showed IcRn product in a range from 1.4 to 1.9 mV at 4.2K, and critical current Ic of about 0.6 mA. Upon measurement of critical current Ic of 100 Josephson junctions connected in series on a substrate, the critical current Ic showed variance (σ/X) of 18.6%.

Observation of the barrier layer with an analytical type transmission electron microscope revealed portions of disturbed lattice with thickness of 3 nm or larger at many points. Composition analysis of the barrier layer at portions where thickness was 1 nm or less showed composition of (Y+Yb):Ba:Cu=30:34:36. Atoms having ionic radius in the case of being 6-coordinated with oxygen of 0.0947 nm or larger was Ba which accounted for 34% in terms of cation atom ratio.

Example 7

Ramp-edge type Josephson junctions were manufactured by using $Nd_{0.9}Ba_{1.9}La_{0.2}Cu_3O_y$ for the first superconductor layer and $Y_{0.9}Ba_{1.9}La_{0.2}Cu_3O_y$ for the second superconductor layer, by the artificial barrier technique that formed a thin $Y_2Cu_2O_5$ film before forming the second superconductor layer.

First, the first superconductor layer was formed on a substrate made of MgO and an inter-layer insulation film made of $CeO_2$ was formed thereon, each to a thickness of 200 nm by the off-axis high frequency sputtering process. Then similarly to Example 1, the inter-layer insulation film and the first superconductor were processed to form a gentle slope. A $Y_2Cu_2O_5$ film about 3 nm thick was formed thereon by laser deposition, and further over which the second superconductor layer was formed.

Ten Josephson junctions formed on the substrate all showed I-V characteristics of the RSJ type. These Josephson junctions also showed IcRn products in a range from 1.9 to 2.3 mV at 4.2K, and critical current Ic of about 0.8 mA. Upon measurement of critical current Ic of 100 Josephson junctions connected in series on a substrate, the critical current Ic showed variance (σ/X) of 7.5%.

Observation of the barrier layer with an analytical type transmission electron microscope similarly to Example 1 showed that thickness was 1 nm or less at most points, and the composition was Nd:Ba:Y:Cu=15:36:20:29. Atoms having ionic radius in the case of being 6-coordinated with oxygen of 0.0947 nm or larger were Nd and Ba which accounted for 51% in terms of cation atom ratio.

Comparative Example 3

Ramp-edge type Josephson junctions were manufactured by the IEJ technique similarly to Example 3, although the process of forming the $Y_2Cu_2O_5$ film was omitted.

Among the ten junctions formed on the substrate, four junctions showed I-V characteristics of the FF type, not a Josephson junction. The remaining six showed I-V characteristics of the RSJ type, indicating they were Josephson junctions.

These Josephson junctions showed IcRn product in a range from 0.4 to 0.8 mV at 4.2K, and critical current Ic of about 0.1 mA.

Observation of the barrier layer with analytical type transmission electron microscope revealed portions of disturbed lattice with thickness of 3 nm or larger at many points. Composition analysis of the barrier layer at portions where thickness was 1 nm or less showed composition of Nd:Ba:Y:Cu=33:39:7:21. Atoms having ionic radius in the case of being 6-coordinated with oxygen of 0.0947 nm or larger were Nd and Ba which accounted for 72% in terms of cation atom ratio.

Example 8

Ramp-edge type Josephson junction was manufactured by artificial barrier technique similarly to Example 7, except for using $Y_{0.2}Nd_{0.9}Ba_{1.9}Cu_3O_y$ for the first superconductor layer and $Y_{0.9}Nd_{0.2}Ba_{1.9}Cu_3O_y$ for the second superconductor layer, while forming a thin $Y_2BaCuO_5$ film before forming the second superconductor layer.

Ten Josephson junctions formed on the substrate all showed I-V characteristics of the RSJ type. They also showed IcRn product in a range from 2.1 to 2.5 mV at 4.2K, and critical current Ic of about 1.0 mA. Upon measurement of critical current Ic of 100 Josephson junctions connected in series on a substrate, the critical current Ic showed variance ($\sigma$/X) of 7.3%.

Observation of the barrier layer with analytical type transmission electron microscope similarly to Example 5 showed that the thickness was 1 nm or less at most points, and composition of Nd:Ba:Y:Cu=19:34:22:25. Atoms having ionic radius in case of being 6-coordinated with oxygen of 0.0947 nm or larger were Nd and Ba which accounted for 53% in terms of cation atom ratio.

Comparative Example 4

Ramp-edge type Josephson junction was manufactured by the artificial barrier technique similarly to Example 8, except for forming $Nd_4Ba_2Cu_2O_{10}$ film instead of the $Y_2BaCuO_5$ before forming the second superconductor layer.

Among the ten junctions formed on the substrate, three junctions showed I-V characteristic of FF type, not Josephson junction. The remaining seven showed I-V characteristics of the RSJ type, indicating they were Josephson junctions.

These Josephson junctions showed IcRn product in a range from 0.5 to 1.1 mV at 4.2K, and critical current Ic of about 0.1 mA.

Observation of the barrier layer with an analytical type transmission electron microscope revealed portions of disturbed lattice with thickness of 3 nm or larger at many points. Composition analysis of the barrier layer at portions where thickness was 1 nm or less showed composition of Nd:Ba:Cu=29:37:34. Atoms having ionic radius in the case of being 6-coordinated with oxygen of 0.0947 nm or larger were Nd and Ba which accounted for 66% in terms of cation atom ratio.

2. Stacked Type High Temperature Superconducting Josephson Junction

Example 9

Stacked type superconducting Josephson junctions were manufactured by using $Y_{0.9}Ba_{1.9}La_{0.2}Cu_3O_y$ for the first superconductor and $Yb_{0.9}Ba_{1.9}La_{0.2}Cu_3 O_y$ for the second superconductor by using the IEJ technique. The substrate was made of MgO and the inter-layer insulation film was made of $CeO_2$.

First, the first superconductor layer and the inter-layer insulation film were formed by off-axis high frequency sputtering processes both to thickness of 200 nm. Then, the inter-layer insulation film was coated with photo-resist by a spin coating process, with the photo-resist film being patterned by photolithography so as to make a mask. Then the inter-layer insulation film was etched by Ar ions applied with acceleration voltage of 400 V and ion current 50 mA using the mask, thereby to form an opening in the inter-layer insulation film at a position where the Josephson junction is to be formed.

The exposed surface of the first superconductor is covered with a damage layer caused by Ar ion bombardment. With the remaining resist being removed by means of an ashing apparatus, the second superconductor layer was formed on the inter-layer insulation film and the first superconductor by laser deposition process.

Ten Josephson junctions formed on the substrate all showed I-V characteristics of the RSJ type. These Josephson junctions also showed IcRn product in a range from 1.2 to 1.6 mV at 4.2K, and critical current Ic of about 0.3 mA. Measurement of critical current Ic of ten Josephson junctions formed on a substrate showed variance ($\sigma$/X) of 9.8%.

Observation of the barrier layer with an analytical type transmission electron microscope having electron beam of about 1 nm diameter showed that thickness was 1 nm or less at most points. Composition analysis of the barrier layer at 20 points by means of the analytical type transmission electron microscope showed that composition was (Y+Yb):Ba:La:Cu=20:37:10:33. Atoms having ionic radius in the case of being 6-coordinated with oxygen of 0.0947 nm or larger were Ba and La which accounted for 47% in terms of cation atom ratio.

Example 10

Ramp-edge type Josephson junctions were manufactured by using $Y_{0.9}Nd_{0.2}Ba_{1.9}Cu_3O_y$ for the first superconductor layer and $Y_{0.95}Nd_{0.1}Ba_{1.95}Cu_3O_y$ for the second superconductor layer, by the artificial barrier technique that formed a thin $Nd_2CuO_4$ film before forming the second superconductor layer. In this example, thickness of the $Nd_2CuO_4$ film was changed to study the effect of the thickness on the Josephson junction.

First, the first superconductor layer was formed on a substrate made of MgO and an inter-layer insulation film made of $CeO_2$ was formed thereon, each to a thickness of 200 nm by the off-axis high frequency sputtering process. Then, similarly to Example 1, the inter-layer insulation film and the first superconductor were processed to form a gentle slope. $Nd_2CuO_4$ films having thicknesses ranging from about 0.5 to 50 nm were formed by laser deposition, whereon the second superconductor layer was then formed.

Nine kinds of samples (Nos. 1 through 9) having different thickness of $Nd_2CuO_4$ film were made in the process described above.

I-V characteristic, critical current Ic, variance σ/X of critical current Ic and ratio (Nd+Ba):(Y+Cu) were determined for each sample, with the data shown in Table 1. The I-V characteristics and critical currents Ic were measured on ten Josephson junctions formed on the substrate. I-V characteristics are indicated in the table as FF, RSJ or resistor. The variance σ/X was determined from measurements of critical current Ic of 100 Josephson junctions formed on the same substrate at 4.2K.

TABLE 6

| Sample No. | Thickness of $Nd_2CuO_4$ (nm) | I—V characteristic | Ic (mA) | σ/X (%)* | (Nd + Ba):(Y + Cu) |
|---|---|---|---|---|---|
| 1 | 0.5 | FF | — | — | — |
| 2 | 1 | RSJ | 2 | 11 | 34:66 |
| 3 | 2 | RSJ | 1 | 6.9 | 35:65 |
| 4 | 3 | RSJ | 0.7 | 7.6 | 48:52 |
| 5 | 5 | RSJ | 0.4 | 9.8 | 65:32 |
| 6 | 10 | RSJ | 0.1 | 17.6 | 67:33 |
| 7 | 20 | RSJ | 0.05 | 24.3 | 72:28 |
| 8 | 30 | Resistor | — | — | — |
| 9 | 50 | Resistor | — | — | — |

*Measured at 4.2 K.

Table 6 shows that I-V characteristics of the RSJ type is obtained when thickness of the $Nd_2CuO_4$ film is in a range from 1 to 20 nm, and the variance σ/X becomes less than 10% when the thickness is in a range from 2 to 5 nm. It was also found that samples that are from 2 to 3 nm thick, in particular, show I-V characteristics of the RSJ type with variance σ/X less than 8%, thus showing the effect of suppressing the variability in characteristics.

It was also found that the variance σ/X becomes less than 10% when, while atoms having ionic radius in the case of being 6-coordinated with oxygen of 0.0947 nm or larger are Nd and Ba, sum of the numbers of Nd and Ba (Nd+Ba) is from 35 to 65% in terms of cation atom ratio.

INDUSTRIAL APPLICABILITY

In the Josephson junction according to the first aspect of the present invention, the two superconductors that interpose the barrier layer include one or more elements selected from the group of Y, La, Nd, Sm, Eu, Gd, Dy, Ho, Er, Tm, Yb and Lu, one or more elements selected from the group of Ba, Sr and Ca, and Cu and oxygen (O), so that each of the two superconductors include at least five elements of different composition from each other. This constitution enables control of the characteristics of the junction, and provides a Josephson junction of high reliability that can meet the requirements for the design of various circuits, on a stable basis, for ease of operation.

Also the method of manufacturing the Josephson junction with ease of operation is provided.

In the high temperature superconducting Josephson junction according to the second aspect of the present invention, the superconductors that interpose the barrier layer include one or more elements (RE) selected from the group of Y, La, Nd, Sm, Eu, Gd, Dy, Ho, Er, Tm, Yb and Lu, one or more elements (AE) selected from the group of Ba, Sr and Ca, and Cu and oxygen (O), while the barrier layer includes one or more elements (RE1) selected from the group of La, Nd, Sm and Eu, and one or more elements (RE2) selected from the group of Y, Gd, Dy, Ho, Er, Tm, Yb and Lu. This constitution improves the lattice matching between the barrier layer and the two superconductors, thus achieving more stable Josephson junctions. As a consequence, a Josephson junction can be provided that has good RSJ characteristics, and has extremely small variance in the critical current Ic and in IcRn product.

It is also made possible to manufacture a plurality of Josephson junctions having small variance in characteristics with high reproducibility, by restricting the constituent elements of the superconductors and the barrier layer as described above.

The superconducting electronic device of the present invention that has one or more high temperature superconducting Josephson junctions of the first aspect of the present invention has the Josephson junctions of high reliability that can meet the requirements imposed by the design of various circuits.

The superconducting electronic device of the present invention that has one or more high temperature superconducting Josephson junctions of the second aspect of the present invention allows it to suppress the variability in the characteristics of the Josephson junctions provided in a superconducting electronic device to a low level, thus improving the electrical characteristics and reliability of the superconducting electronic device. As a result, electrical characteristics and reliability of the product that uses the superconducting electronic device can be improved.

It is also made possible to manufacture the superconducting electronic device having one or more Josephson junctions that has less variability in characteristics with good reproducibility.

Thus, the present invention has very high significance to the industry.

What is claimed is:

1. A high temperature superconducting Josephson junction having a barrier layer sandwiched by two superconductors wherein each of said two superconductors include
   (a) one or more elements selected from the group of Y, La, Nd, Sm, Eu, Gd, Dy, Ho, Er, Tm, Yb and Lu;
   (b) one or more elements selected from the group of Ba, Sr and Ca;
   (c) Cu; and
   (d) oxygen (O);
   so that each of said two superconductor layers independently includes at least five elements selected from among the above (a) to (d) so that each superconductor layer has a different composition from the other.

2. The high temperature superconducting Josephson junction according to claim 1, wherein said barrier layer includes
   (e) one or more elements selected from the group of La, Nd, Sm and Eu, and
   (f) one or more elements selected from the group of Y, Gd, Dy, Ho, Er, Tm, Yb and Lu.

3. The high temperature superconducting Josephson junction according to claim 1, wherein said barrier layer includes cations with ionic radius in the case of being 6-coordinated with oxygen (O) 0.0947 nm or larger in a concentration from 35 to 65% in terms of cation atom ratio.

4. The high temperature superconducting Josephson junction according to claim 2, wherein said barrier layer includes cations with ionic radius in the case of being 6-coordinated with oxygen (O) 0.0947 nm or larger in a concentration from 35 to 65% in terms of cation atom ratio.

5. The high temperature superconducting Josephson junction according to any one of claims 1 to 4, wherein said two superconductor layers and said barrier layer have a ramp-edge type or a stacked type structure.

6. A method of manufacturing, by means of a physical film forming process, a high temperature superconducting Josephson junction having a barrier layer sandwiched by two superconductors wherein said two superconductors include
- (a) one or more elements selected from the group of Y, La, Nd, Sm, Eu, Gd, Dy, Ho, Er, Tm, Yb and Lu;
- (b) one or more elements selected from the group of Ba, Sr and Ca;
- (c) Cu; and
- (d) oxygen (O);
wherein a plurality of element sources are disposed in an airtight film forming chamber and said plurality of element sources are switched as required so as to form the upper and lower superconductor layers of different compositions each including at least five elements selected from among the above (a) to (d).

7. A superconducting device that has one or more of the high temperature superconducting Josephson junctions of any one of claims 1 to 4.

8. A superconducting device that has one or more of the high temperature superconducting Josephson junctions of claim 5.

9. A superconducting device that has one or more of the high temperature superconducting Josephson junctions manufactured by the method of claim 6.

10. A high temperature superconducting Josephson junction having a barrier layer sandwiched by two superconductors wherein each superconductor independently includes:
- (a) one or more elements selected from the group of Y, La, Nd, Sm, Eu, Gd, Dy, Ho, Er, Tm, Yb and Lu;
- (b) one or more elements selected from the group of Ba, Sr and Ca;
- (c) Cu; and
- (d) oxygen (O);
so that each of said two superconductor layers includes at least five elements selected from among the above (a) to (d).

11. A high temperature superconducting Josephson junction having a barrier layer sandwiched by two superconductors wherein each superconductor independently includes:
- (a) one or more elements selected from the group of Y, La, Nd, Sm, Eu, Gd, Dy, Ho, Er, Tm, Yb and Lu;
- (b) one or more elements selected from the group of Ba, Sr and Ca;
- (c) Cu; and
- (d) oxygen (O);
so that each of said two superconductor layers includes at least five elements selected from among the above (a) to (d) and that at least one of the at least five elements is different between the two superconductor layers.

12. The high temperature superconducting Josephson junction according to claim 11, wherein said barrier layer includes:
- (e) one or more elements selected from the group of La, Nd, Sm and Eu; and
- (f) one or more elements selected from the group of Y, Gd, Dy, Ho, Er, Tm, Yb and Lu.

13. The high temperature superconducting Josephson junction according to claim 11, wherein said barrier layer includes cations with ionic radius in the case of being 6-coordinated with oxygen (O) 0.0947 nm or larger in a concentration from 35 to 65% in terms of cation atom ratio.

14. The high temperature superconducting Josephson junction according to claim 12, wherein said barrier layer includes cations with ionic radius in the case of being 6-coordinated with oxygen (O) 0.0947 nm or larger in a concentration from 35 to 65% in terms of cation atom ratio.

15. The high temperature superconducting Josephson junction according to any one of claims 11 to 14, wherein said two superconductor layers and said barrier layer have a ramp-edge type or a stacked type structure.

16. A method of manufacturing, by means of a physical film forming process, a high temperature superconducting Josephson junction having a barrier layer sandwiched by two superconductors wherein said two superconductors include:
- (a) one or more elements selected from the group of Y, La, Nd, Sm, Eu, Gd, Dy, Ho, Er, Tm, Yb and Lu;
- (b) one or more elements selected from the group of Ba, Sr, and Ca;
- (c) Cu; and
- (d) oxygen (O);
wherein a plurality of element sources are disposed in an airtight film forming chamber and said plurality of element sources are switched as required, so as to form the upper and lower superconductor layers each including at least five elements from among the above (a) to (d), at least one of said at least five elements being different between the two superconductor layers.

17. A superconducting device that has one or more of the high temperature superconducting Josephson junctions of any one of claims 11 to 14.

18. A superconducting device that has one or more of the high temperature superconducting Josephson junctions of claim 15.

19. A superconducting device that has one or more of the high temperature superconducting Josephson junctions manufactured by the method of claim 16.

* * * * *